US011942538B2

(12) United States Patent
Masuda et al.

(10) Patent No.: US 11,942,538 B2
(45) Date of Patent: Mar. 26, 2024

(54) SILICON CARBIDE SEMICONDUCTOR DEVICE

(71) Applicant: Sumitomo Electric Industries, Ltd., Osaka (JP)

(72) Inventors: Takeyoshi Masuda, Osaka (JP); Yu Saitoh, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 418 days.

(21) Appl. No.: 17/427,129

(22) PCT Filed: Jan. 22, 2020

(86) PCT No.: PCT/JP2020/002095
§ 371 (c)(1),
(2) Date: Jul. 30, 2021

(87) PCT Pub. No.: WO2020/162175
PCT Pub. Date: Aug. 13, 2020

(65) Prior Publication Data
US 2022/0149197 A1    May 12, 2022

(30) Foreign Application Priority Data
Feb. 4, 2019    (JP) .................................. 2019-017745

(51) Int. Cl.
*H01L 29/78*    (2006.01)
*H01L 29/16*    (2006.01)

(52) U.S. Cl.
CPC ...... *H01L 29/7813* (2013.01); *H01L 29/1608* (2013.01)

(58) Field of Classification Search
CPC ............. H01L 29/7813; H01L 29/1608; H01L 29/0615; H01L 29/086; H01L 29/0696; H01L 29/7397; H01L 29/0623; H01L 29/0878; H01L 29/1095; H01L 29/66068
See application file for complete search history.

(56) References Cited

U.S. PATENT DOCUMENTS 10,367,092 B2 *   7/2019   Wakimoto .......... H01L 29/1095
2014/0027784 A1   1/2014   Wada et al.
2016/0225854 A1   8/2016   Wada et al.
(Continued)

FOREIGN PATENT DOCUMENTS

JP    2014-041990 A    3/2014
JP    2015-060859 A    3/2015
(Continued)

*Primary Examiner* — Allison Bernstein
(74) *Attorney, Agent, or Firm* — McCarter & English, LLP; Michael A. Sartori

(57) ABSTRACT

In the direction from the first main surface toward the second main surface through each of the second impurity region and the fourth impurity region, a concentration profile of an n-type impurity has a second relative maximum value and a fourth relative maximum value located closer to the first main surface than a position where the second relative maximum value is exhibited. The fourth relative maximum value is larger than the third relative maximum value, the third relative maximum value is larger than the second relative maximum value, and the second relative maximum value is larger than the first relative maximum value.

13 Claims, 13 Drawing Sheets

(56) References Cited

U.S. PATENT DOCUMENTS

2018/0138274 A1    5/2018  Ohse et al.
2023/0326960 A1*  10/2023  Kumada ............... H01L 29/063
                                                      257/77

FOREIGN PATENT DOCUMENTS

JP        2017-011031 A    1/2017
JP        2018-082058 A    5/2018

* cited by examiner

SILICON CARBIDE SEMICONDUCTOR DEVICE

TECHNICAL FIELD

The present disclosure relates to a silicon carbide semiconductor device. The present application claims priority to Japanese Patent Application No. 2019-017745 filed on Feb. 4, 2019, the entire contents of which are herein incorporated by reference.

BACKGROUND ART

Japanese Patent Laying-Open No. 2014-041990 (PTL 1) describes a trench metal oxide semiconductor field effect transistor (MOSFET).

CITATION LIST

Patent Literature

PTL 1: Japanese Patent Laying-Open No. 2014-041990

SUMMARY OF INVENTION

A silicon carbide semiconductor device according to the present disclosure includes a silicon carbide substrate including a first main surface and a second main surface opposite to the first main surface. The silicon carbide substrate includes a first impurity region containing a p-type impurity, a second impurity region provided on the first impurity region, the second impurity region containing an n-type impurity, a third impurity region provided on the second impurity region, the third impurity region containing a p-type impurity, a fourth impurity region provided on the third impurity region at a distance from the second impurity region, the fourth impurity region containing an n-type impurity, and a fifth impurity region in contact with each of the first impurity region and the second impurity region, the fifth impurity region containing an n-type impurity. In the first main surface, a gate trench is provided, the gate trench including a side surface in contact with each of the second impurity region, the third impurity region, and the fourth impurity region and a bottom surface continuous to the side surface and being in contact with the second impurity region. In a direction from the first main surface toward the second main surface through each of the first impurity region and the third impurity region, a concentration profile of the p-type impurity has a first relative maximum value and a third relative maximum value located closer to the first main surface than a position where the first relative maximum value is exhibited. In the direction from the first main surface toward the second main surface through each of the second impurity region and the fourth impurity region, a concentration profile of the n-type impurity has a second relative maximum value and a fourth relative maximum value located closer to the first main surface than a position where the second relative maximum value is exhibited. The fourth relative maximum value is larger than the third relative maximum value, the third relative maximum value is larger than the second relative maximum value, and the second relative maximum value is larger than the first relative maximum value.

DETAILED DESCRIPTION

Figure 1:
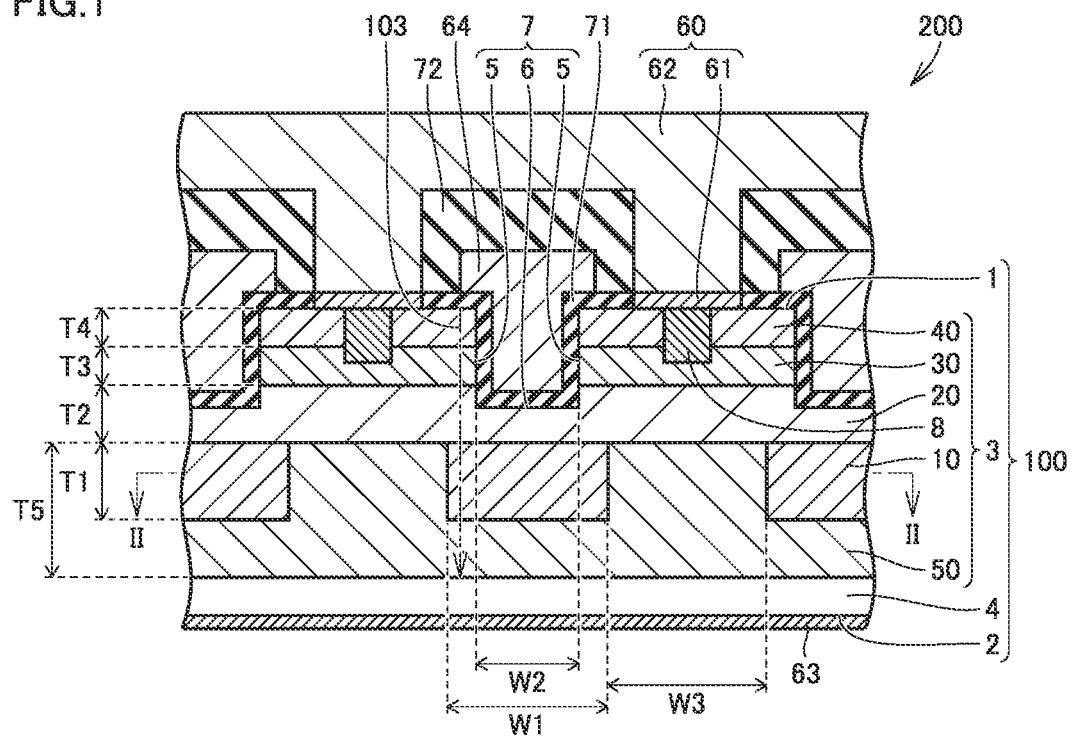
FIG. 1 is a schematic vertical cross-sectional view showing a structure of a silicon carbide semiconductor device according to a first embodiment.

Problem to be Solved by the Present Disclosure

An object of the present disclosure is to provide a silicon carbide semiconductor device in which variation in breakdown voltage can be lessened.

Advantageous Effect of the Present Disclosure

According to the present disclosure, a silicon carbide semiconductor device in which variation in breakdown voltage can be lessened can be provided.

Overview of Embodiments of the Present Disclosure

Overview of embodiments of the present disclosure will initially be described. Regarding crystallographic denotation herein, an individual orientation, a group orientation, an individual plane, and a group plane are shown in [ ], < >, ( ), and { }, respectively. A crystallographically negative index is normally expressed by a number with a bar "-" thereabove, however, it is herein expressed by a negative sign preceding a number.

(1) A silicon carbide semiconductor device 200 according to the present disclosure includes a silicon carbide substrate 100 including a first main surface 1 and a second main surface 2 opposite to first main surface 1. Silicon carbide substrate 100 includes a first impurity region 10 containing a p-type impurity, a second impurity region 20 provided on first impurity region 10, second impurity region 20 containing an n-type impurity, a third impurity region 30 provided on second impurity region 20, third impurity region 30 containing a p-type impurity, a fourth impurity region 40 provided on third impurity region 30 at a distance from second impurity region 20, fourth impurity region 40 containing an n-type impurity, and a fifth impurity region 50 in contact with each of first impurity region 10 and second impurity region 20, fifth impurity region 50 containing an n-type impurity. In first main surface 1, a gate trench 7 is provided, gate trench 7 including a side surface 5 in contact with each of second impurity region 20, third impurity region 30, and fourth impurity region 40 and a bottom surface 6 continuous to side surface 5 and being in contact with second impurity region 20. In a direction from first main surface 1 toward second main surface 2 through each of first impurity region 10 and third impurity region 30, a concentration profile of the p-type impurity has a first relative maximum value N1 and a third relative maximum value N3 located closer to the first main surface than a position where first relative maximum value N1 is exhibited. In the direction from first main surface 1 toward second main surface 2 through each of second impurity region 10 and fourth impurity region 40, a concentration profile of the n-type impurity has a second relative maximum value N2 and a fourth relative maximum value N4 located closer to the first main surface than a position where second relative maximum value N2 is exhibited. Fourth relative maximum value N4 is larger than third relative maximum value N3, third relative maximum value N3 is larger than second relative maximum value N2, and second relative maximum value N2 is larger than first relative maximum value N1.

(2) In silicon carbide semiconductor device 200 according to (1), a total of a thickness of first impurity region 10, a thickness of second impurity region 20, a thickness of third impurity region 30, and a thickness of fourth impurity region 40 may be not larger than 1.5 µm.

(3) In silicon carbide semiconductor device 200 according to (1) or (2), first impurity region 10 may have a thickness not larger than 0.5 µm.

(4) In silicon carbide semiconductor device 200 according to any one of (1) to (3), second impurity region 20 may have a thickness not larger than 0.5 µm.

(5) In silicon carbide semiconductor device 200 according to any one of (1) to (4), first relative maximum value N1 may be larger than $5 \times 10^{16}$ cm$^{-3}$.

(6) In silicon carbide semiconductor device 200 according to any one of (1) to (5), second relative maximum value N2 may be larger than $1 \times 10^{17}$ cm$^{-3}$.

(7) In silicon carbide semiconductor device 200 according to any one of (1) to (6), third relative maximum value N3 may be larger than $1 \times 10^{18}$ cm$^{-3}$.

(8) In silicon carbide semiconductor device 200 according to any one of (1) to (7), fourth relative maximum value N4 may be larger than $1 \times 10^{19}$ cm$^{-3}$.

(9) In silicon carbide semiconductor device 200 according to any one of (1) to (8), when viewed in a direction perpendicular to second main surface 2, at least a part of first impurity region 10 may be arranged as being superimposed on bottom surface 6.

(10) In silicon carbide semiconductor device 200 according to (9), when viewed in the direction perpendicular to second main surface 2, first impurity region 10 may extend along a first direction 101 in parallel to second main surface 2 and bottom surface 6 may extend along a second direction 102 in parallel to second main surface 2 and perpendicular to first direction 101.

(11) In silicon carbide semiconductor device 200 according to (9), when viewed in the direction perpendicular to second main surface 2, first impurity region 10 may extend along a first direction 101 in parallel to second main surface 2 and bottom surface 6 may extend along first direction 101.

(12) In silicon carbide semiconductor device 200 according to any one of (1) to (12), when viewed in a direction perpendicular to second main surface 2, first impurity region 10 may be arranged as not being superimposed on bottom surface 6.

(13) In silicon carbide semiconductor device 200 according to (12), when viewed in the direction perpendicular to second main surface 2, bottom surface 6 extends along a first direction 101 in parallel to second main surface 2 and first impurity region 10 extends along a second direction 102 in parallel to second main surface 2 and perpendicular to first direction 101.

DETAILS OF EMBODIMENTS OF THE PRESENT DISCLOSURE

Details of embodiments of the present disclosure will be described below. The same or corresponding elements in the description below have the same reference characters allotted and identical description thereof will not be repeated.

First Embodiment

A construction of a MOSFET as silicon carbide semiconductor device 200 according to a first embodiment will initially be described.

As shown in FIG. 1, silicon carbide semiconductor device 200 according to the present embodiment mainly includes silicon carbide substrate 100, a gate electrode 64, a gate insulating film 71, an interlayer insulating film 72, a source electrode 60, and a drain electrode 63. Silicon carbide substrate 100 includes first main surface 1 and second main surface 2 opposite to first main surface 1. Silicon carbide substrate 100 includes a silicon carbide single-crystal substrate 4 and a silicon carbide epitaxial layer 3 provided on silicon carbide single-crystal substrate 4. Second main surface 2 is defined by silicon carbide single-crystal substrate 4. First main surface 1 is defined by silicon carbide epitaxial layer 3.

Silicon carbide single-crystal substrate 4 is composed of hexagonal silicon carbide having, for example, a polytype of 4H. First main surface 1 of silicon carbide substrate 100 has a maximal diameter, for example, of 150 mm and preferably not smaller than 150 mm. First main surface 1 is, for example, a {0001} plane or a surface angled off by not greater than 8° from the {0001} plane. Specifically, first main surface 1 is, for example, a (0001) plane or a surface angled off by at most 8° from the (0001) plane. First main surface 1 may be, for example, a (000-1) plane or a surface angled off by at most 8° from the (000-1) plane. Silicon carbide single-crystal substrate 4 has a thickness, for example, of 350 μm and not greater than 500 μm.

Silicon carbide epitaxial layer 3 mainly includes first impurity region 10, second impurity region 20, third impurity region 30, fourth impurity region 40, fifth impurity region 50, and a contact region 8. First impurity region 10 is, for example, an electric field relaxation region. Second impurity region 20 is, for example, a current diffusion region. Third impurity region 30 is, for example, a channel layer (body region). Fourth impurity region 40 is, for example, a source region. Fifth impurity region 50 is, for example, a drift region.

First impurity region 10 contains a p-type impurity (a first p-type impurity). The first p-type impurity is a p-type impurity capable of providing the p-type such as aluminum (Al) or boron (B). First impurity region 10 is a p-type region. First impurity region 10 has a thickness (a first thickness T1), for example, of 0.35 μm. First thickness T1 may be, for example, not larger than 0.5 μm or not larger than 0.4 μm. Though a lower limit of first thickness T1 is not particularly limited, it may be, for example, not smaller than 0.1 μm.

Second impurity region 20 contains an n-type impurity (a first n-type impurity). Second impurity region 20 is provided on first impurity region 10. The first n-type impurity is an n-type impurity capable of providing the n-type such as nitrogen (N) or phosphorus (P). Second impurity region 20 is an n-type region. Second impurity region 20 has a thickness (a second thickness T2), for example, of 0.3 μm. Second thickness T2 may be, for example, not larger than 0.5 μm or not larger than 0.4 μm. Though a lower limit of second thickness T2 is not particularly limited, it may be, for example, not smaller than 0.1 μm. Second thickness T2 may be smaller than first thickness T1.

Third impurity region 30 contains a p-type impurity (a second p-type impurity). Third impurity region 30 is provided on second impurity region 20. The second p-type impurity is a p-type impurity capable of providing the p-type such as aluminum (Al) or boron (B). Third impurity region 30 is a p-type region. Third impurity region 30 has a thickness (a third thickness T3), for example, of 0.2 μm. Third thickness T3 may be, for example, not larger than 0.3 μm or not larger than 0.25 μm. Though a lower limit of third thickness T3 is not particularly limited, it may be, for example, not smaller than 0.1 μm. Third thickness T3 may be smaller than second thickness T2.

Fourth impurity region 40 contains an n-type impurity (a second n-type impurity). Fourth impurity region 40 is provided on third impurity region 30 at a distance from second impurity region 20. The second n-type impurity is an n-type impurity capable of providing the n-type such as nitrogen (N) or phosphorus (P). Fourth impurity region 40 is an n-type region. Fourth impurity region 40 has a thickness (a fourth thickness T4), for example, of 0.25 μm. Fourth thickness T4 may be, for example, not larger than 0.35 μm or not larger than 0.3 μm. Though a lower limit of fourth thickness T4 is not particularly limited, it may be, for example, not smaller than 0.1 μm. Fourth thickness T4 may be larger than third thickness T3.

Fifth impurity region 50 contains an n-type impurity (a third n-type impurity). Fifth impurity region 50 is in contact with each of first impurity region 10 and second impurity region 20. The third n-type impurity is an n-type impurity capable of providing the n-type such as nitrogen (N). Fifth impurity region 50 is an n-type region. A thickness (fifth thickness T5) of fifth impurity region 50 is larger than the thickness (first thickness T1) of first impurity region 10. The thickness (fifth thickness T5) of fifth impurity region 50 may be larger, for example, than 0.5 μm.

Contact region 8 contains a third p-type impurity. Contact region 8 is in contact, for example, with each of third impurity region 30 and fourth impurity region 40. The third p-type impurity is a p-type impurity capable of providing the p-type such as aluminum (Al) or boron (B). Contact region 8 is a p-type region. A thickness of contact region 8 may be larger than the thickness (fourth thickness T4) of fourth impurity region 40.

The first p-type impurity may be identical to or different from the second p-type impurity. The first p-type impurity may be aluminum and the second p-type impurity may be aluminum. The first p-type impurity may be aluminum and the second p-type impurity may be boron. Similarly, the first p-type impurity may be identical to or different from the third p-type impurity. Similarly, the second p-type impurity may be identical to or different from the third p-type impurity.

The first n-type impurity may be identical to or different from the second n-type impurity. The first n-type impurity may be nitrogen and the second n-type impurity may be nitrogen. The first n-type impurity may be nitrogen and the second n-type impurity may be phosphorus. Similarly, the first n-type impurity may be identical to or different from the third n-type impurity. Similarly, the second n-type impurity may be identical to or different from the third n-type impurity.

A total of the thickness (first thickness T1) of first impurity region 10, the thickness (second thickness T2) of second impurity region 20, the thickness (third thickness T3) of third impurity region 30, and the thickness (fourth thickness T4) of fourth impurity region 40 may be, for example, not larger than 1.5 μm. The total of first thickness T1, second thickness T2, third thickness T3, and fourth thickness T4 may be, for example, not larger than 1.35 μm or not larger than 1.1 μm. Though a lower limit of the total of first thickness T1, second thickness T2, third thickness T3, and fourth thickness T4 is not particularly limited, it may be, for example, not smaller than 0.5 μm.

First main surface 1 is provided with gate trench 7. Gate trench 7 includes side surface 5 and bottom surface 6. Bottom surface 6 is continuous to side surface 5. Side surface 5 is continuous to first main surface 1. Side surface 5 extends along a direction substantially perpendicular to first main surface 1. Bottom surface 6 is substantially in parallel to first main surface 1. A boundary between side surface 5 and bottom surface 6 may be formed to have a curvature. Gate trench 7 has a depth, for example, not smaller than 0.5 μm and not larger than 1.5 μm. Side surface 5 is in contact with each of second impurity region 20, third impurity region 30, and fourth impurity region 40. Bottom surface 6 is in contact with second impurity region 20. Bottom surface 6 is distant from third impurity region 30. Bottom surface 6 may be distant from or in contact with first impurity region 10.

Gate insulating film 71 is composed, for example, of silicon dioxide. Gate insulating film 71 is provided as being in contact with side surface 5 and bottom surface 6 of gate trench 7. The gate insulating film is in contact with each of second impurity region 20, third impurity region 30, and fourth impurity region 40 at side surface 5. The gate insulating film is in contact with second impurity region 20 at bottom surface 6. A channel can be formed in third impurity region 30 in contact with gate insulating film 71. Gate insulating film 71 has a thickness, for example, not smaller than 40 nm and not larger than 150 nm.

Gate electrode 64 is provided on gate insulating film 71. Gate electrode 64 is arranged as being in contact with gate insulating film 71. The gate electrode is provided to bury a groove defined by gate insulating film 71. Gate electrode 64 is composed of a conductor such as polysilicon doped with an impurity.

Source electrode 60 includes an electrode layer 61 and a source interconnection 62. Electrode layer 61 is composed, for example, of an Ni alloy. Source electrode 60 is in contact with fourth impurity region 40. Source electrode 60 may be in contact with contact region 8. Electrode layer 61 is composed, for example, of a material containing Ti, Al, and Si. Source interconnection 62 is composed, for example, of a material containing AlSiCu.

Interlayer insulating film 72 is provided to cover gate electrode 64. Interlayer insulating film 72 is in contact with each of gate electrode 64 and gate insulating film 71. Interlayer insulating film 72 is made, for example, from a non-doped silicate glass (NSG) film or a phosphorus silicate glass (PSG) film. Interlayer insulating film 72 electrically isolates gate electrode 64 and source electrode 60 from each other.

Drain electrode 63 is provided as being in contact with second main surface 2 of silicon carbide substrate 100. Drain electrode 63 is electrically connected to fifth impurity region 50 on a side of second main surface 2. Drain electrode 63 is composed of a material that can establish ohmic contact with n-type silicon carbide single-crystal substrate 4 such as nickel silicide (NiSi). Drain electrode 63 is electrically connected to silicon carbide single-crystal substrate 4.

Figure 2:
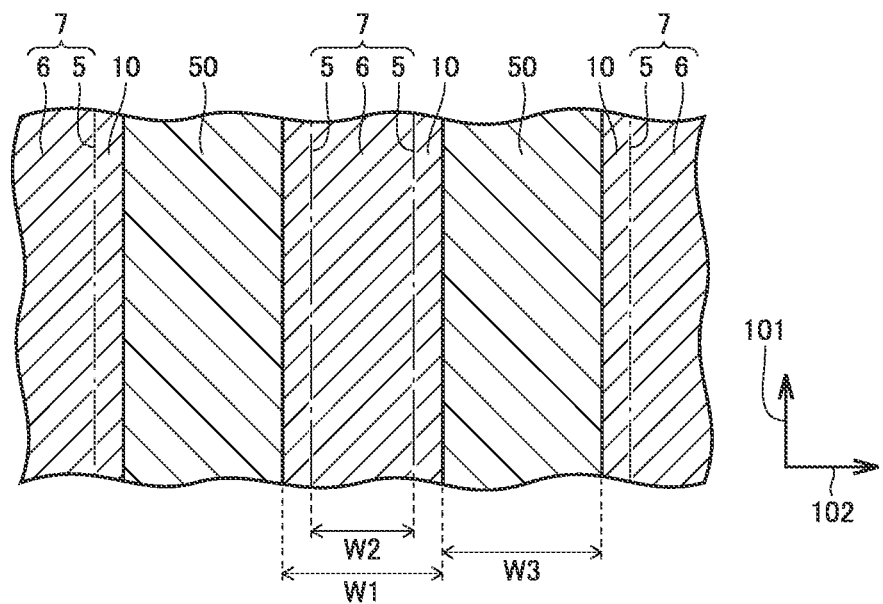
FIG. 2 is a schematic lateral cross-sectional view along the line II-II in FIG. 1.

FIG. 2 is a schematic lateral cross-sectional view along the line II-II in FIG. 1. As shown in FIG. 2, when viewed in the direction perpendicular to second main surface 2, gate trench 7 extends along first direction 101. First direction 101 corresponds to a longitudinal direction of gate trench 7. Second direction 102 corresponds to a direction of a short side of gate trench 7. When viewed in the direction perpendicular to second main surface 2, gate trench 7 is substantially rectangular.

First direction 101 is, for example, a <11-20> direction. Second direction 102 is, for example, a <1-100> direction. First direction 101 may be, for example, a direction resulting from projection of the <11-20> direction on first main surface 1. Second direction 102 may be, for example, a direction resulting from projection of the <1-100> direction on first main surface 1. Each of first direction 101 and second direction 102 is in parallel to second main surface 2.

As shown in FIG. 2, when viewed in the direction perpendicular to second main surface 2, at least a part of first impurity region 10 may be arranged as being superimposed on bottom surface 6 of gate trench 7. Preferably, when viewed in the direction perpendicular to second main surface 2, the entire bottom surface 6 is arranged as being superimposed on first impurity region 10. When viewed in the direction perpendicular to second main surface 2, first impurity region 10 extends along first direction 101. From another point of view, the longitudinal direction of first impurity region 10 corresponds to first direction 101 and the direction of the short side of first impurity region 10 corresponds to second direction 102. A width of first impurity region 10 in first direction 101 is larger than a width (a first width W1) of first impurity region 10 in second direction 102. First width W1 is, for example, not smaller than 0.5 µm and not larger than 2.0 µm. First width W1 may be larger than first thickness T1.

As shown in FIG. 2, when viewed in the direction perpendicular to second main surface 2, bottom surface 6 of gate trench 7 extends along first direction 101. From another point of view, the longitudinal direction of bottom surface 6 corresponds to first direction 101 and the direction of the short side of bottom surface 6 corresponds to second direction 102. A width of bottom surface 6 in first direction 101 is larger than a width (a second width W2) of bottom surface 6 in second direction 102. Second width W2 is, for example, not smaller than 0.1 µm and not larger than 1.5 µm. Second width W2 may be smaller than first width W1. Gate trenches 7 may be provided at regular intervals in second direction 102. Similarly, first impurity regions 10 may be provided at regular intervals in second direction 102. An interval W3 between two adjacent first impurity regions 10 is, for example, not smaller than 0.5 µm and not larger than 5.0 µm.

Figure 3:
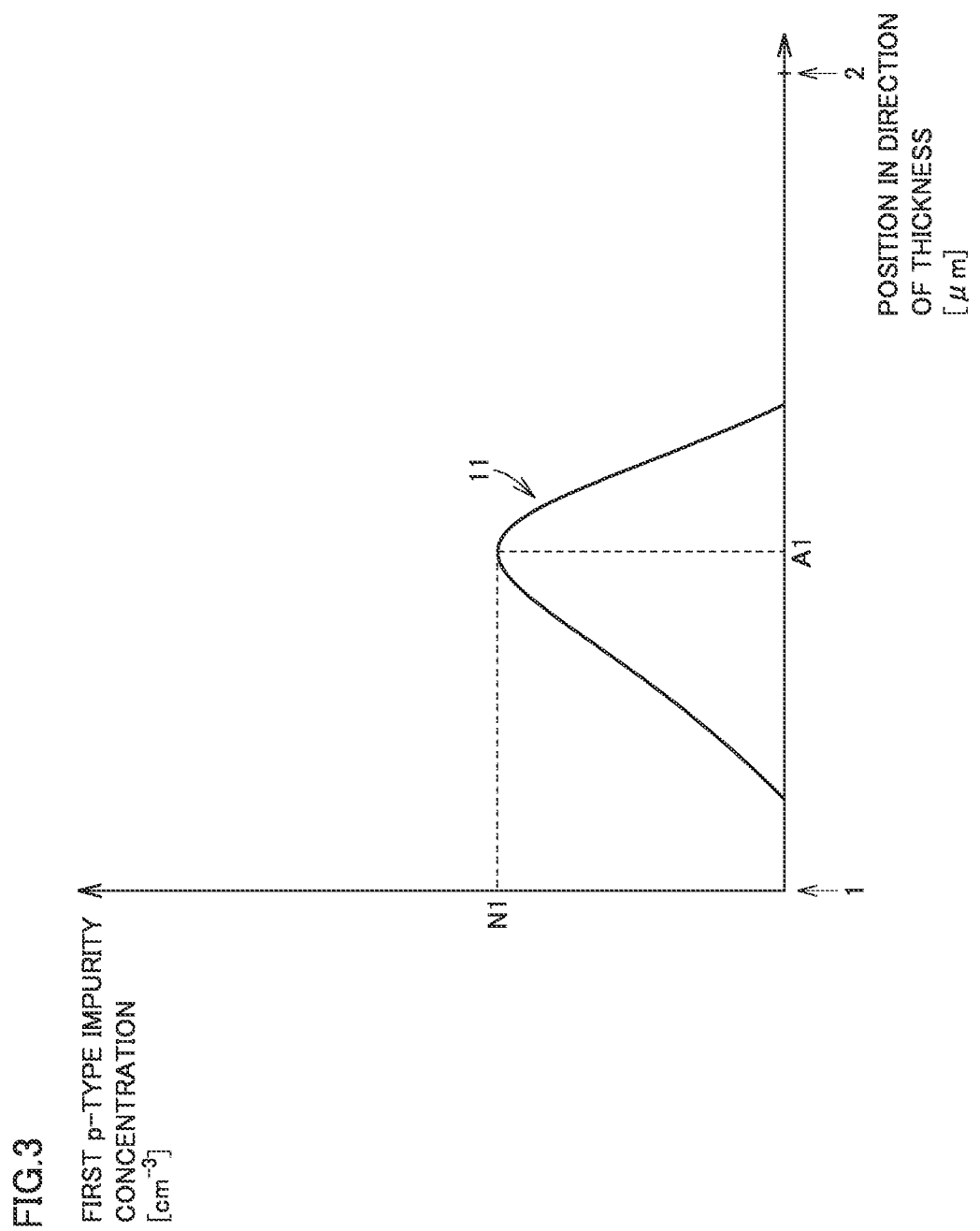
FIG. 3 is a schematic diagram showing a concentration profile of a first p-type impurity in a direction of thickness of a silicon carbide substrate.

FIG. 3 is a schematic diagram showing a concentration profile of the first p-type impurity in a direction of thickness of the silicon carbide substrate. The abscissa in FIG. 3 represents a position in the direction of thickness. The ordinate in FIG. 3 represents a concentration of the first p-type impurity. The concentration of the first p-type impurity is measured, for example, in a direction along an arrow 103 in FIG. 1.

As shown in FIG. 3, in a direction from first main surface 1 toward second main surface 2, the concentration profile of the first p-type impurity (a first concentration profile 11) has a first relative maximum value N1. The concentration profile of the first p-type impurity exhibits first relative maximum value N1 at a first position A1. From first position A1 toward first main surface 1, the concentration of the first p-type impurity monotonously decreases. Similarly, from first position A1 toward second main surface 2, the concentration of the first p-type impurity monotonously decreases. First relative maximum value N1 is a maximum value of the concentration of the first p-type impurity in first impurity region 10. First relative maximum value N1 is, for example, larger than $5 \times 10^{16}$ cm$^{-3}$. First relative maximum value N1 may be, for example, larger than $1 \times 10^{7}$ cm$^{-3}$ or larger than $1 \times 10^{18}$ cm$^{-3}$. Though an upper limit of first relative maximum value N1 is not particularly limited, it may be, for example, not larger than $5 \times 10^{18}$ cm$^{-3}$.

Figure 4:
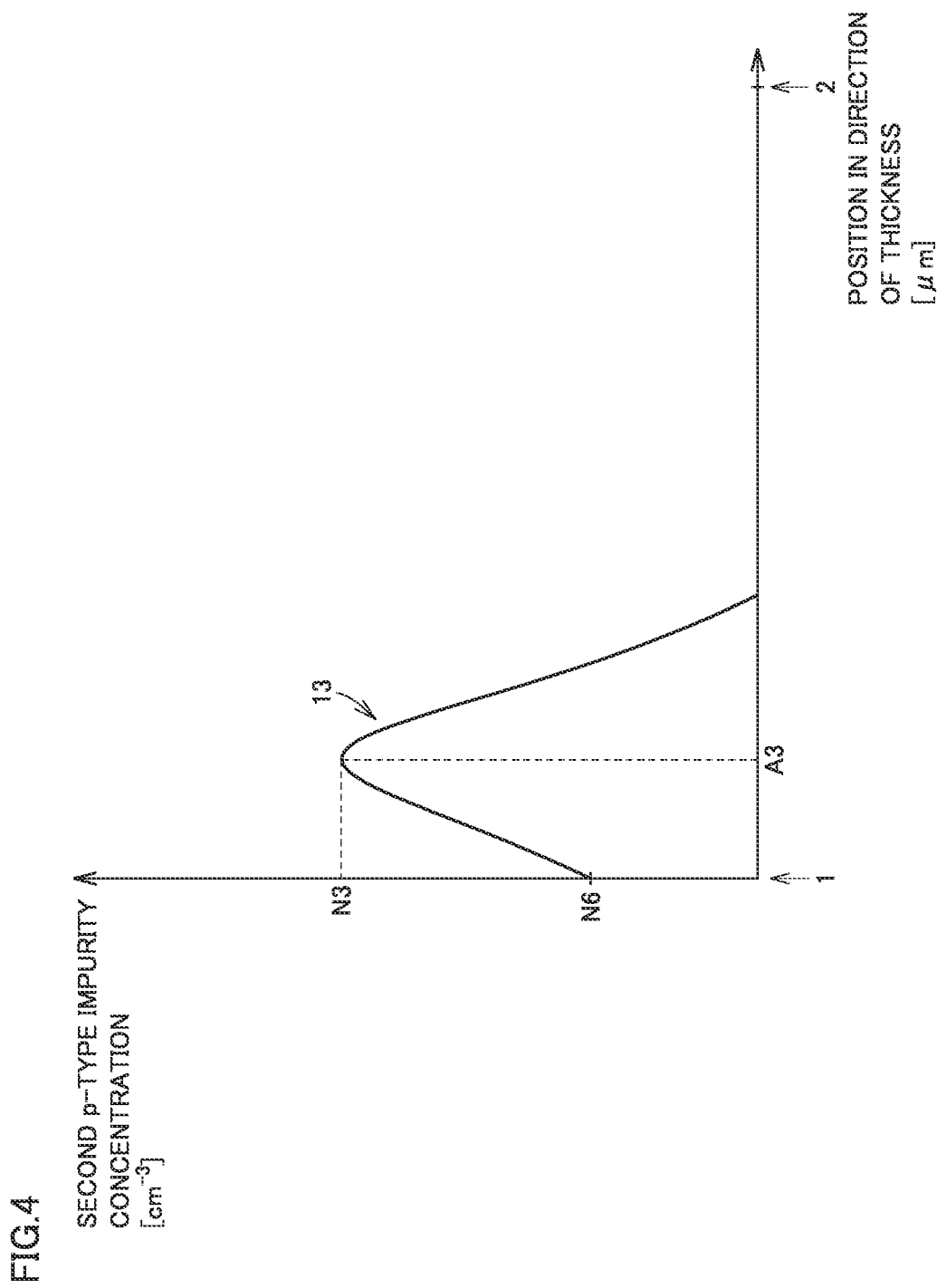
FIG. 4 is a schematic diagram showing a concentration profile of a second p-type impurity in the direction of thickness of the silicon carbide substrate.

FIG. 4 is a schematic diagram showing a concentration profile of the second p-type impurity in the direction of thickness of the silicon carbide substrate. The abscissa in FIG. 4 represents a position in the direction of thickness. The ordinate in FIG. 4 represents a concentration of the second p-type impurity. The concentration of the second p-type impurity is measured, for example, in the direction along arrow 103 in FIG. 1.

As shown in FIG. 4, in the direction from first main surface 1 toward second main surface 2, the concentration profile of the second p-type impurity (a third concentration profile 13) has a third relative maximum value N3. The concentration profile of the second p-type impurity exhibits third relative maximum value N3 at a third position A3. From third position A3 toward first main surface 1, the concentration of the second p-type impurity monotonously decreases. Similarly, from third position A3 toward second main surface 2, the concentration of the second p-type impurity monotonously decreases. Third relative maximum value N3 is a maximum value of the concentration of the second p-type impurity in third impurity region 30. Third relative maximum value N3 is larger than first relative maximum value N1. Third relative maximum value N3 is, for example, larger than $1\times10^{18}$ cm$^{-3}$. Third relative maximum value N3 may be, for example, larger than $2\times10^{18}$ cm$^{-3}$ or larger than $5\times10^{18}$ cm$^{-3}$. Though an upper limit of third relative maximum value N3 is not particularly limited, it may be, for example, not larger than $1\times10^{19}$ cm$^{-3}$. As shown in FIG. 4, the concentration profile of the second p-type impurity may reach first main surface 1. The concentration of the second p-type impurity (a second concentration N6) at first main surface 1 may be lower than third relative maximum value N3.

Figure 5:
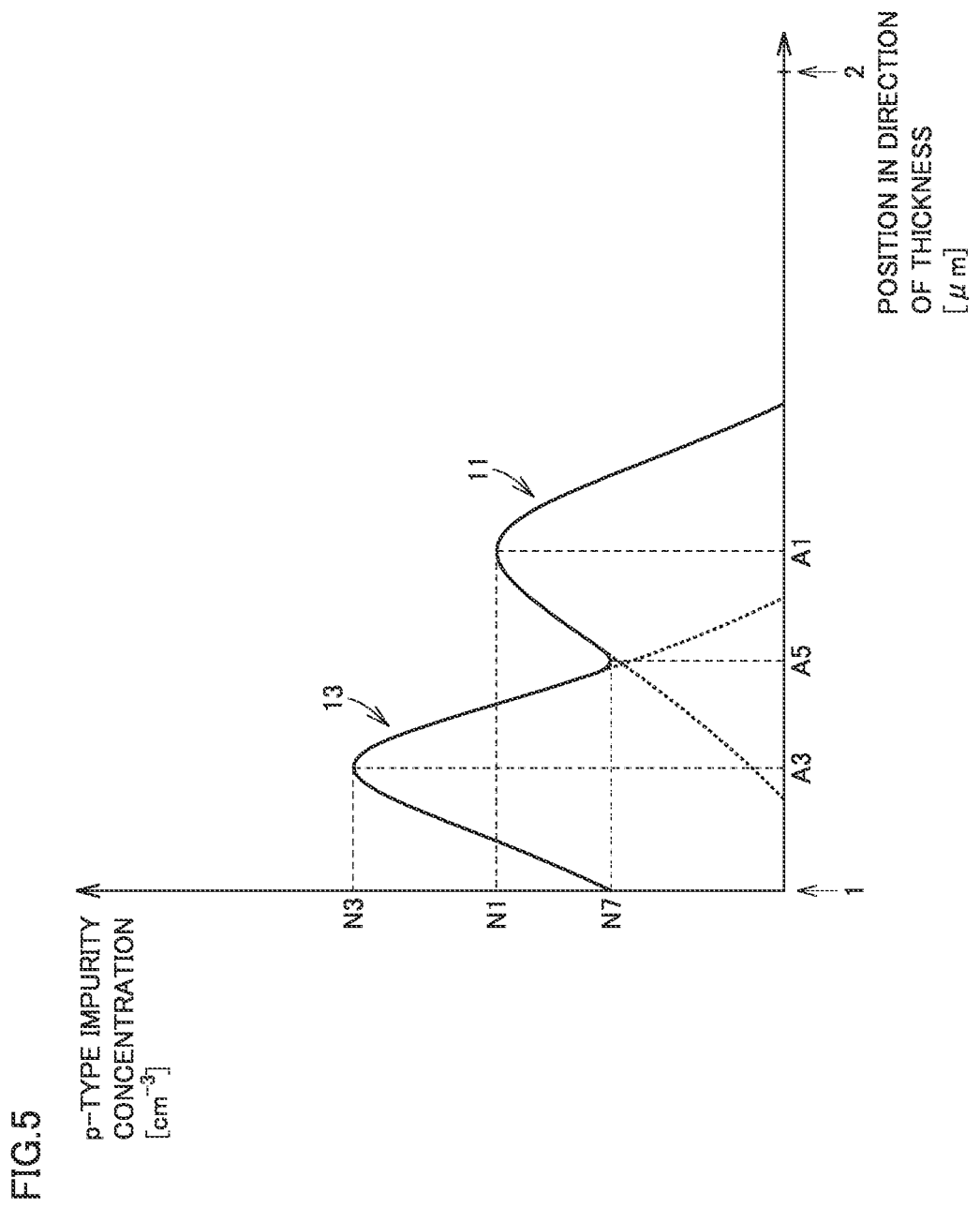
FIG. 5 is a schematic diagram showing a concentration profile of the p-type impurity in the direction of thickness of the silicon carbide substrate.

FIG. 5 is a schematic diagram showing a concentration profile of the p-type impurity in the direction of thickness of the silicon carbide substrate. The abscissa in FIG. 5 represents a position in the direction of thickness. The ordinate in FIG. 5 represents a concentration of the p-type impurity. The concentration of the p-type impurity is measured, for example, in the direction along arrow 103 in FIG. 1. The concentration profile shown in FIG. 5 is formed as the concentration profile shown in FIG. 3 and the concentration profile shown in FIG. 4 are superimposed on each other. As shown in FIG. 5, in the direction from first main surface 1 toward second main surface 2 through each of first impurity region 10 and third impurity region 30, the concentration profile of the p-type impurity has first relative maximum value N1 and third relative maximum value N3 located (third position A3) closer to the first main surface than the position (first position A1) where first relative maximum value N1 is exhibited.

As shown in FIG. 5, the concentration profile of the p-type impurity has a first relative minimum value N7. The concentration profile of the p-type impurity has first relative minimum value N7 at a fifth position A5. Fifth position A5 is located between first position A1 and third position A3. First relative minimum value N7 is smaller than first relative maximum value N1.

Figure 6:
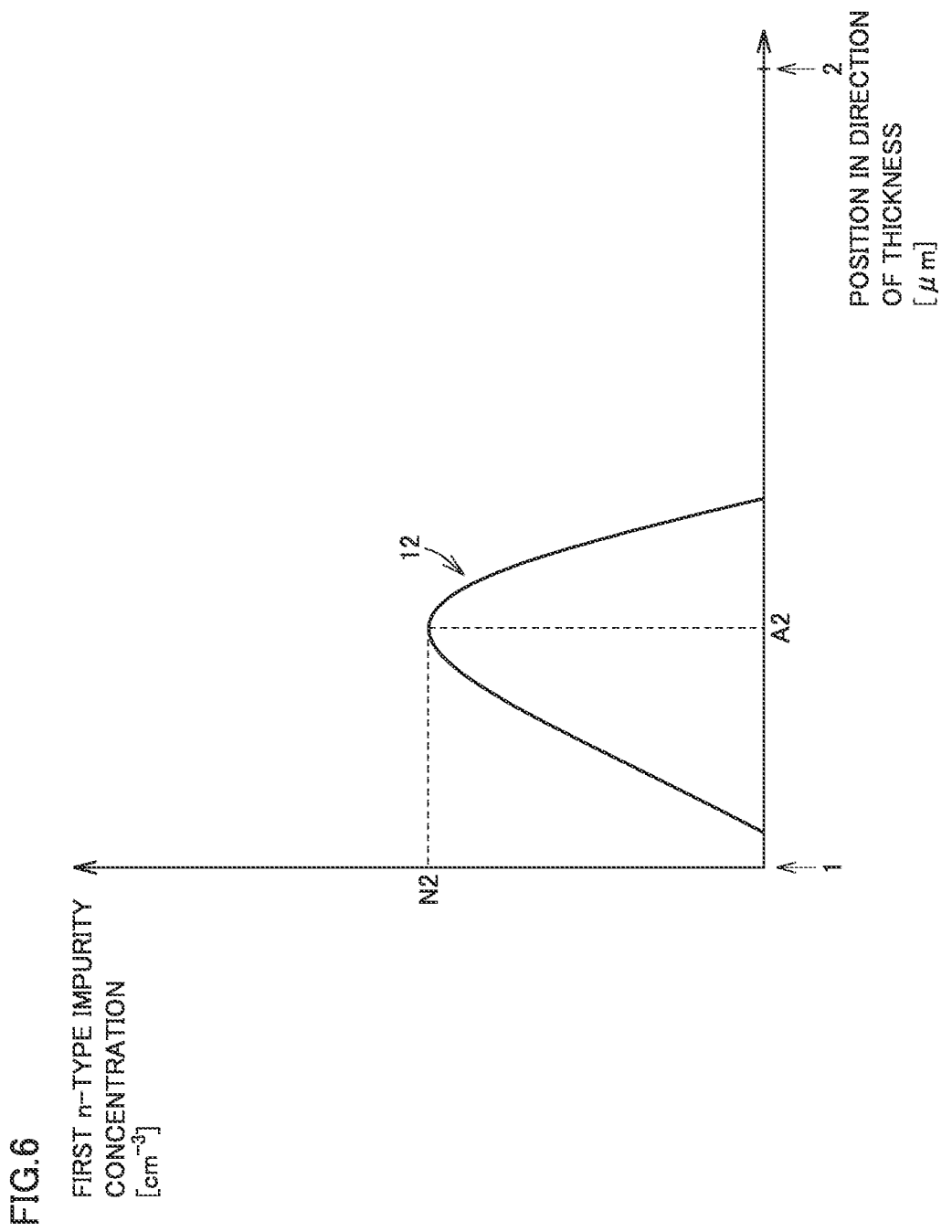
FIG. 6 is a schematic diagram showing a concentration profile of a first n-type impurity in the direction of thickness of the silicon carbide substrate.

FIG. 6 is a schematic diagram showing a concentration profile of the first n-type impurity in the direction of thickness of the silicon carbide substrate. The abscissa in FIG. 6 represents a position in the direction of thickness. The ordinate in FIG. 6 represents a concentration of the first n-type impurity. The concentration of the first n-type impurity is measured, for example, in the direction along arrow 103 in FIG. 1.

As shown in FIG. 6, in the direction from first main surface 1 toward second main surface 2, the concentration profile (a second concentration profile 12) of the first n-type impurity has a second relative maximum value N2. The concentration profile of the first n-type impurity exhibits second relative maximum value N2 at a second position A2. From second position A2 toward first main surface 1, the concentration of the first n-type impurity monotonously decreases. Similarly, from second position A2 toward second main surface 2, the concentration of the first n-type impurity monotonously decreases. Second relative maximum value N2 is a maximum value of the concentration of the first n-type impurity in second impurity region 20. Second relative maximum value N2 is larger than first relative maximum value N1. Second relative maximum value N2 is, for example, larger than $1\times10^{17}$ cm$^{-3}$. Second relative maximum value N2 may be, for example, larger than $2\times10^{17}$ cm$^{-3}$ or larger than $5\times10^{17}$ cm$^{-3}$. Though an upper limit of second relative maximum value N2 is not particularly limited, it may be, for example, not larger than $1\times10^{18}$ cm$^{-3}$.

Figure 7:
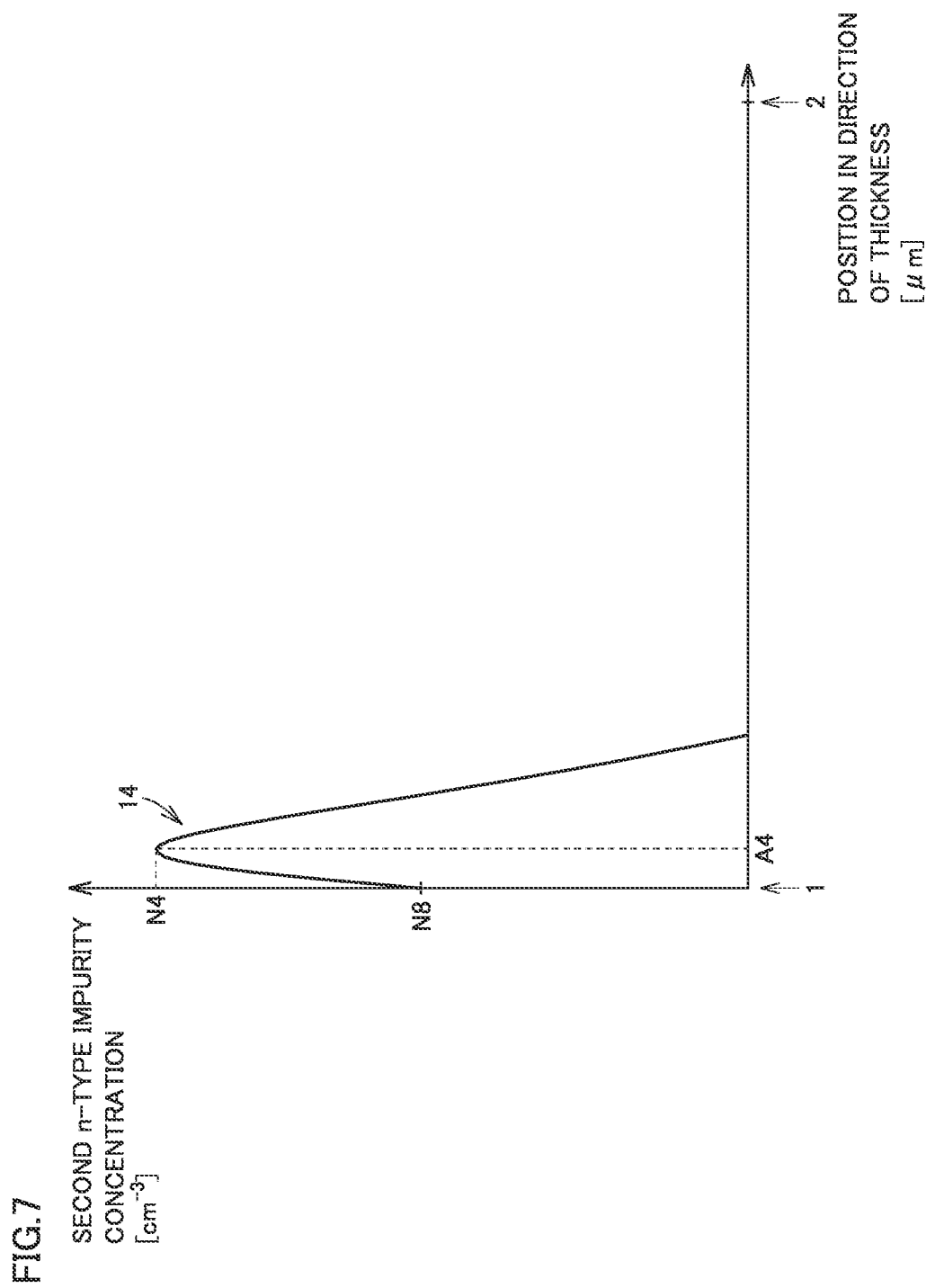
FIG. 7 is a schematic diagram showing a concentration profile of a second n-type impurity in the direction of thickness of the silicon carbide substrate.

FIG. 7 is a schematic diagram showing a concentration profile of the second n-type impurity in the direction of thickness of the silicon carbide substrate. The abscissa in FIG. 7 represents a position in the direction of thickness. The ordinate in FIG. 7 represents a concentration of the second n-type impurity. The concentration of the second n-type impurity is measured, for example, in the direction along arrow 103 in FIG. 1.

As shown in FIG. 7, in the direction from first main surface 1 toward second main surface 2, the concentration profile (a fourth concentration profile 14) of the second n-type impurity has a fourth relative maximum value N4. The concentration profile of the second n-type impurity exhibits fourth relative maximum value N4 at a fourth position A4. From fourth position A4 toward first main surface 1, the concentration of the second n-type impurity monotonously decreases. Similarly, from fourth position A4 toward second main surface 2, the concentration of the second n-type impurity monotonously decreases. Fourth relative maximum value N4 is a maximum value of the concentration of the second n-type impurity in fourth impurity region 40.

Fourth relative maximum value N4 is larger than third relative maximum value N3. Third relative maximum value N3 is larger than second relative maximum value N2. Fourth relative maximum value N4 is, for example, larger than $1\times10^{19}$ cm$^{-3}$ Fourth relative maximum value N4 may be, for example, larger than $2\times10^{19}$ cm$^{-3}$ or larger than $5\times10^{19}$ cm$^{-3}$. Though an upper limit of fourth relative maximum value N4 is not particularly limited, it may be, for example, not larger than $1\times10^{20}$ cm$^{-3}$. As shown in FIG. 7, the concentration profile of the second n-type impurity may reach first main surface 1. The concentration (a fourth concentration N8) of the second n-type impurity at first main surface 1 is lower than fourth relative maximum value N4. Fourth concentration N8 is higher than second concentration N6 (see FIG. 4).

Figure 8:
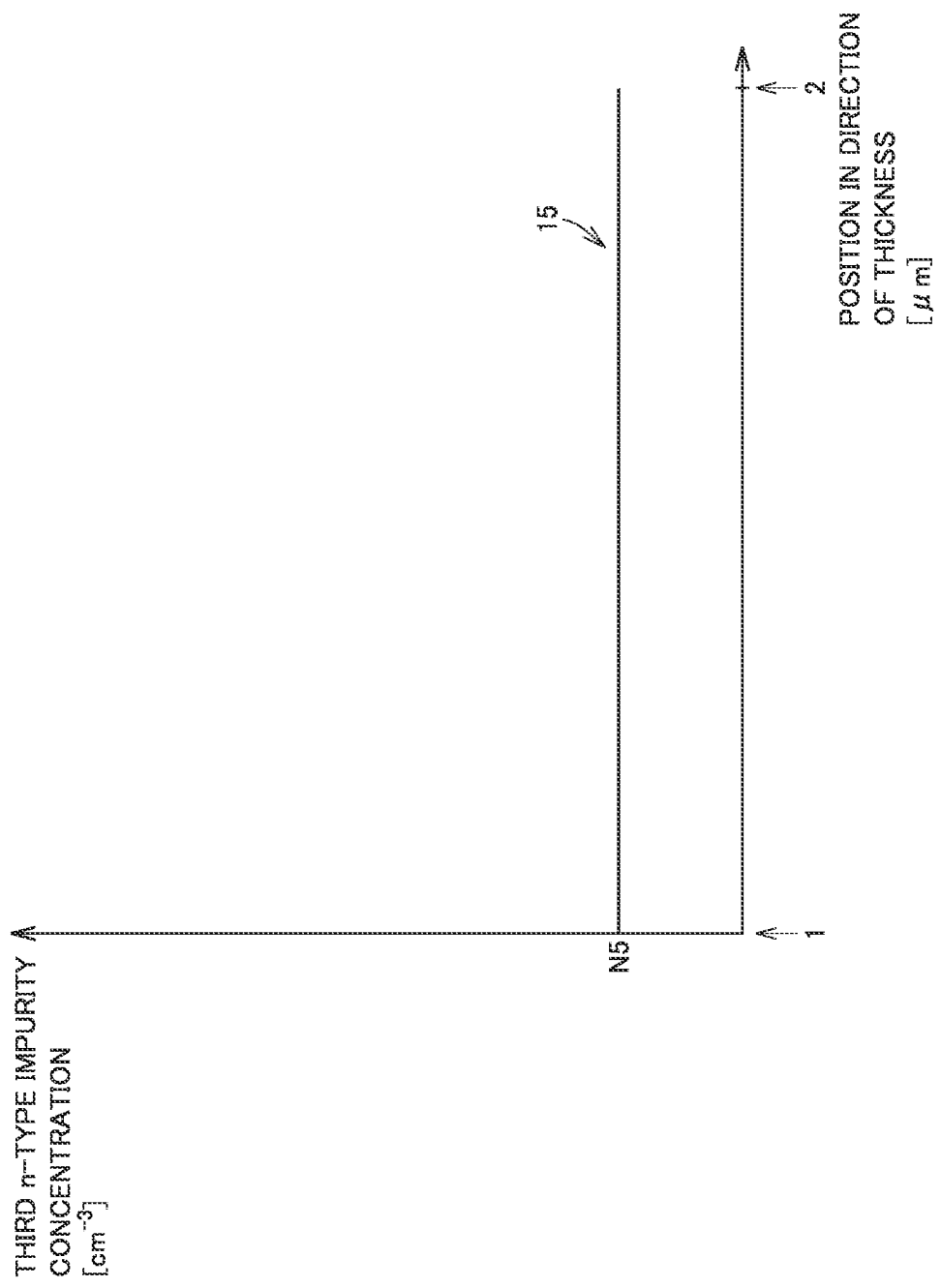
FIG. 8 is a schematic diagram showing a concentration profile of a third n-type impurity in the direction of thickness of the silicon carbide substrate.

FIG. 8 is a schematic diagram showing a concentration profile of the third n-type impurity in the direction of thickness of the silicon carbide substrate. The abscissa in FIG. 8 represents a position in the direction of thickness. The ordinate in FIG. 8 represents a concentration of the third n-type impurity. The concentration of the third n-type impurity is measured, for example, in the direction along arrow 103 in FIG. 1.

As will be described later, the silicon carbide epitaxial layer is formed in one epitaxial growth. As shown in FIG. 8, in the direction from first main surface 1 toward second main surface 2, the concentration (a first concentration N5) of the third n-type impurity is substantially constant. From another point of view, between first main surface 1 and second main surface 2, the concentration profile (a fifth concentration profile 15) of the third n-type impurity is substantially flat. Between first main surface 1 and second main surface 2, fifth concentration profile 15 is continuous. In other words, between first main surface 1 and second main surface 2, fifth concentration profile 15 does not include a discontinuous portion. First concentration N5 is lower than first relative maximum value N1. First concentration N5 is lower, for example, than $5\times10^{16}$ cm$^{-3}$.

Figure 9:
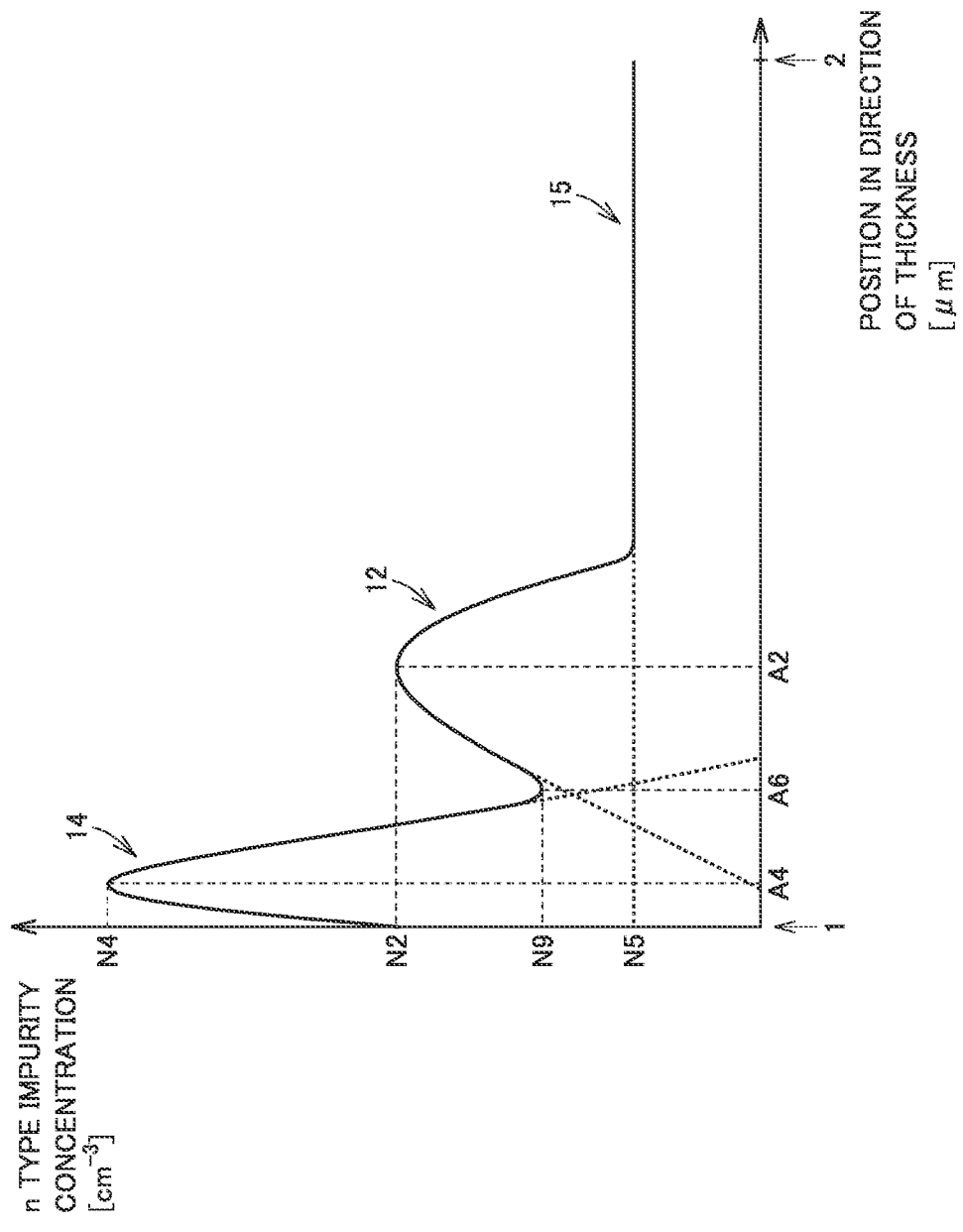
FIG. 9 is a schematic diagram showing a concentration profile of the n-type impurity in the direction of thickness of the silicon carbide substrate.

FIG. 9 is a schematic diagram showing a concentration profile of the n-type impurity in the direction of thickness of the silicon carbide substrate. The abscissa in FIG. 9 represents a position in the direction of thickness. The ordinate in FIG. 9 represents a concentration of the n-type impurity. The concentration of the n-type impurity is measured, for example, in the direction along arrow 103 in FIG. 1. The concentration profile shown in FIG. 9 is formed as the concentration profile shown in FIG. 6, the concentration profile shown in FIG. 7, and the concentration profile shown in FIG. 8 are superimposed on one another. As shown in FIG. 9, in the direction from first main surface 1 toward second main surface 2 through each of second impurity region 20 and fourth impurity region 40, the concentration profile of the n-type impurity has second relative maximum value N2 and fourth relative maximum value N4 located (second position A2) closer to the first main surface than a position (fourth position A4) where second relative maximum value N2 is exhibited.

As shown in FIG. 9, the concentration profile of the n-type impurity has a second relative minimum value N9. The concentration profile of the n-type impurity has second relative minimum value N9 at a sixth position A6. Sixth position A6 is located between second position A2 and fourth position A4. Second relative minimum value N9 is smaller than second relative maximum value N2. Second relative minimum value N9 may be larger than first concentration N5.

Figure 10:
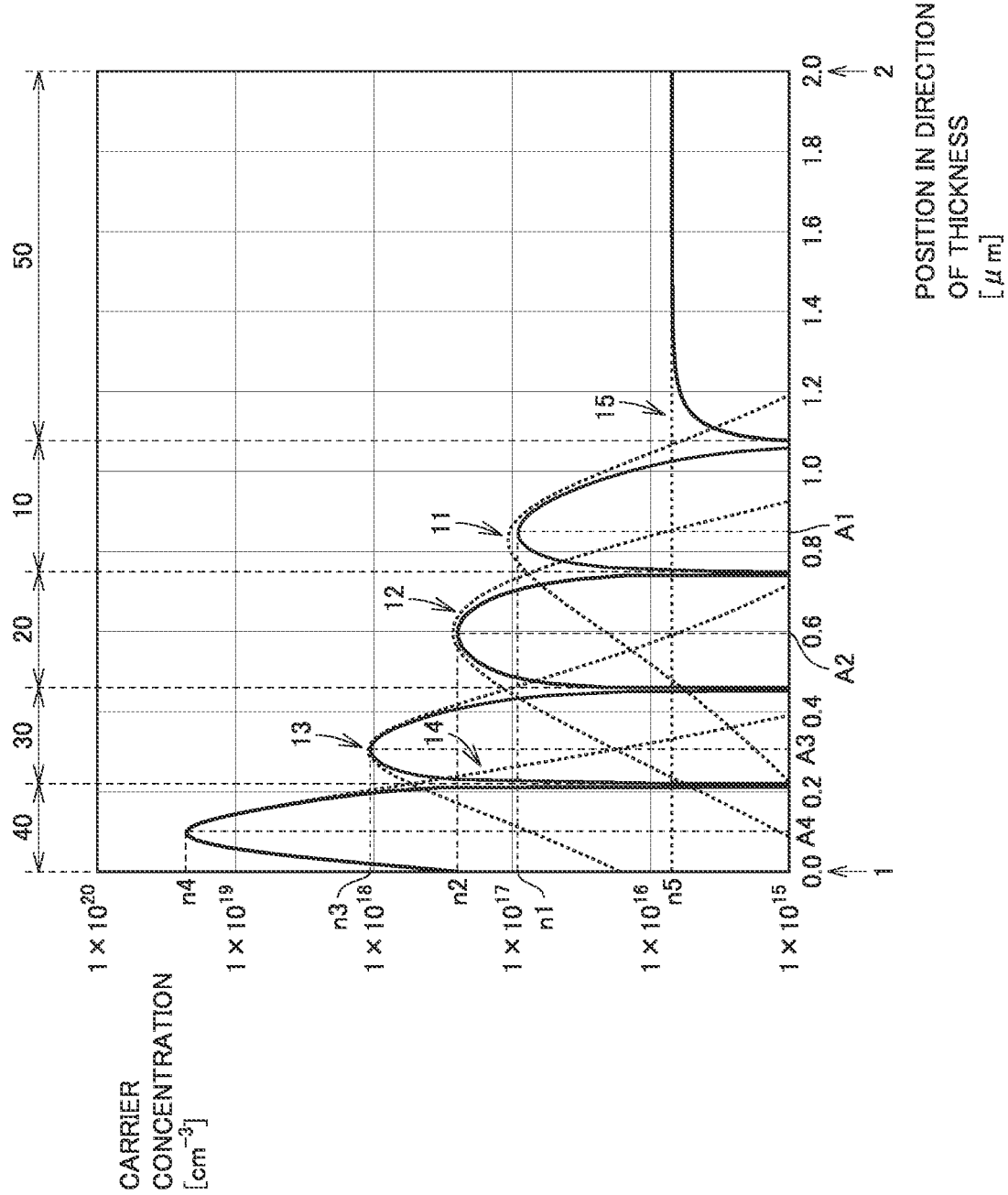
FIG. 10 is a schematic diagram showing a carrier concentration profile in the direction of thickness of the silicon carbide substrate.

FIG. 10 is a schematic diagram showing a carrier concentration profile in the direction of thickness of the silicon carbide substrate. The abscissa in FIG. 10 represents a position in the direction of thickness. The ordinate in FIG. 10 represents a carrier concentration. The carrier concentration is expressed as an absolute value of a difference between the concentration of the n-type impurity and the concentration of the p-type impurity. The carrier concentration is measured, for example, in the direction along arrow 103 in FIG. 1. The carrier concentration profile is shown with a solid line.

As shown in FIG. 10, at first position A1 in the first impurity region, the carrier concentration profile exhibits a fifth relative maximum value n1. Similarly, at second position A2 in second impurity region 20, the carrier concentration profile exhibits a sixth relative maximum value n2. Similarly, at third position A3 in third impurity region 30, the carrier concentration profile exhibits a seventh relative maximum value n3. Similarly, at fourth position A4 in fourth impurity region 40, the carrier concentration profile exhibits an eighth relative maximum value n4. Eighth relative maximum value n4 is larger than seventh relative maximum value n3. Seventh relative maximum value n3 is larger than sixth relative maximum value n2. Sixth relative maximum value n2 is larger than fifth relative maximum value n1. Fifth relative maximum value n1 is larger than the carrier concentration (a third concentration n5) in fifth impurity region 50.

In the direction perpendicular to second main surface 2, fourth position A4 is located between third position A3 and first main surface 1. Similarly, in the direction perpendicular to second main surface 2, third position A3 is located between fourth position A4 and second position A2. Similarly, in the direction perpendicular to second main surface 2, second position A2 is located between third position A3 and first position A1. Similarly, in the direction perpendicular to second main surface 2, first position A1 is located between second position A2 and second main surface 2.

At a boundary between first impurity region 10 and fifth impurity region 50, the carrier concentration profile has a relative minimum value. At a boundary between first impurity region 10 and second impurity region 20, the carrier concentration profile has a relative minimum value. At a boundary between second impurity region 20 and third impurity region 30, the carrier concentration profile has a relative minimum value. At a boundary between third impurity region 30 and fourth impurity region 40, the carrier concentration profile has a relative minimum value.

As shown in FIG. 10, in first impurity region 10, first concentration profile 11, second concentration profile 12, and fifth concentration profile 15 may be superimposed on one another. From another point of view, first impurity region 10 may contain the first n-type impurity, the first p-type impurity, and the third n-type impurity. In second impurity region 20, first concentration profile 11, second concentration profile 12, third concentration profile 13, and fifth concentration profile 15 may be superimposed on one another. From another point of view, second impurity region 20 may contain the first n-type impurity, the first p-type impurity, the second n-type impurity, and the third n-type impurity In third impurity region 30, first concentration profile 11, second concentration profile 12, third concentration profile 13, fourth concentration profile 14, and fifth concentration profile 15 may be superimposed on one another. From another point of view, third impurity region 30 may contain the first n-type impurity, the first p-type impurity, the second n-type impurity, the second p-type impurity, and the third n-type impurity.

In fourth impurity region 40, second concentration profile 12, third concentration profile 13, fourth concentration profile 14, and fifth concentration profile 15 may be superimposed on one another. From another point of view, fourth impurity region 40 may contain the first p-type impurity, the second n-type impurity, the second p-type impurity, and the third n-type impurity. In fifth impurity region 50, first concentration profile 11 and fifth concentration profile 15 may be superimposed on each other. From another point of view, fifth impurity region 50 may contain the first n-type impurity and the third n-type impurity.

A method of measuring the concentration of the p-type impurity and the concentration of the n-type impurity in each impurity region will now be described.

The concentration of the p-type impurity and the concentration of the n-type impurity in each impurity region can be measured by secondary ion mass spectrometry (SIMS). For example, a secondary ion mass spectrometer manufactured by Cameca is adopted as a measurement apparatus. A measurement pitch is set, for example, to 0.01 μm. When nitrogen is to be detected as the n-type impurity, cesium (Cs) is adopted for primary ion beams. Primary ion energy is set to 14.5 keV. Secondary ion polarity is negative. When aluminum or boron is to be detected as the p-type impurity, oxygen ($O_2$) is adopted for primary ion beams. Primary ion energy is set to 8 keV. Secondary ion polarity is positive. The concentration of the p-type impurity and the concentration of the n-type impurity are measured at the center of a silicon carbide epitaxial substrate.

A method of measuring a thickness of each impurity region will now be described.

A scanning capacitance microscope (SCM) is used in a method of distinguishing between a p-type region and an n-type region. For example, NanoScope IV manufactured by Bruker AXS is employed as a measurement apparatus. The SCM is a method of visualizing a distribution of the carrier concentration in a semiconductor. Specifically, a surface of a sample is scanned with a silicon probe coated with a metal. At this time, a high-frequency voltage is applied to the sample. Majority carriers are excited to modulate a capacitance of a system. A frequency of the high-frequency voltage applied to the sample is set to 100 kHz and the voltage is set to 4.0 V. A thickness of each impurity region is measured by the SCM.

An operation of a MOSFET 200 according to the present embodiment will now be described. In a state that a voltage applied to gate electrode 64 is lower than a threshold voltage, that is, in an off state, even when the voltage is applied across source electrode 60 and drain electrode 63, a pn junction between third impurity region 30 and second impurity region 20 is reverse biased and there is no conduction therebetween. When a voltage equal to or higher than the threshold voltage is applied to gate electrode 64, an inverted layer is formed in a channel region around a portion of contact of third impurity region 30 with gate insulating film 71. Consequently, fourth impurity region 40 and second impurity region 20 are electrically connected to each other and a current flows between source electrode 60 and drain electrode 63. MOSFET 200 operates as set forth above.

A method of manufacturing silicon carbide semiconductor device 200 according to the present embodiment will now be described.

Initially, a step of preparing silicon carbide substrate 100 is performed. Silicon carbide single-crystal substrate 4 is prepared, for example, by cutting a substrate by slicing from a silicon carbide single-crystal ingot grown by the modified Lely method and mirror-polishing a surface of the substrate. Silicon carbide single-crystal substrate 4 is composed of hexagonal silicon carbide having, for example, a polytype of 4H. Silicon carbide single-crystal substrate 4 has a diameter, for example, of 150 mm.

Figure 11:
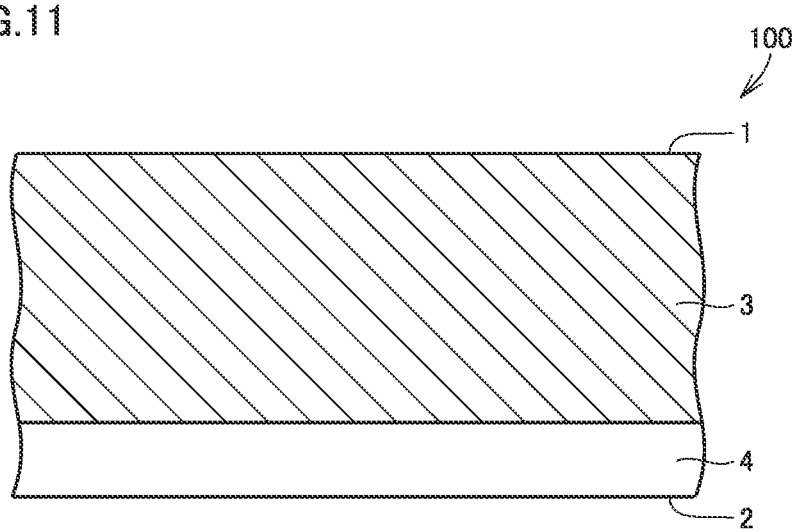
FIG. 11 is a schematic vertical cross-sectional view showing a first step in a method of manufacturing a silicon carbide semiconductor device according to the first embodiment.

Then, a step of forming a silicon carbide epitaxial layer is performed. For example, carrier gas containing hydrogen, source material gas containing silane and propane, and dopant gas containing nitrogen are supplied over silicon carbide single-crystal substrate 4, and silicon carbide single-crystal substrate 4 is heated, for example, to approximately 1550° C. under a pressure of 100 mbar (10 kPa). Silicon carbide epitaxial layer 3 having the n-type is thus formed on silicon carbide single-crystal substrate 4 (see FIG. 11). Silicon carbide epitaxial layer 3 is doped with nitrogen as the n-type impurity. The concentration of the n-type impurity is set, for example, to $8.0 \times 10^{15}$ cm$^{-3}$. As set forth above, silicon carbide substrate 100 including silicon carbide single-crystal substrate 4 and silicon carbide epitaxial layer 3 provided on the silicon carbide single-crystal substrate is prepared. Silicon carbide substrate 100 includes first main surface 1 and second main surface 2. First main surface 1 is, for example, a {0001} plane or a surface angled off by at most 8° from the {0001} plane.

Ions are then implanted into silicon carbide epitaxial layer 3. Initially, a first ion implantation mask (not shown) is provided on first main surface 1. Then, ions of the first p-type impurity are implanted into silicon carbide epitaxial layer 3. First impurity region 10 having the p-type is thus formed. For example, aluminum is employed as the first p-type impurity. Ion implantation energy is, for example, not higher than 900 keV. Then, the first ion implantation mask (not shown) is removed from first main surface 1.

A second ion implantation mask (not shown) is provided on first main surface 1. The second ion implantation mask covers, for example, a guard ring region (not shown). Then, ions of the first n-type impurity are implanted into silicon carbide epitaxial layer 3. Second impurity region 20 having the n-type is thus formed. Second impurity region 20 is formed as being in contact with first impurity region 10. For example, nitrogen is employed as the first n-type impurity. Ion implantation energy is, for example, not higher than 900 keV.

Then, ions of the second p-type impurity are implanted into silicon carbide epitaxial layer 3. Third impurity region 30 having the p-type is thus formed. Third impurity region 30 is formed as being in contact with second impurity region 20. For example, aluminum is employed as the second p-type impurity. Ion implantation energy is, for example, not higher than 900 keV.

Then, ions of the second n-type impurity are implanted into silicon carbide epitaxial layer 3. Fourth impurity region 40 having the n-type is thus formed. Second impurity region 40 is formed as being in contact with third impurity region 30. For example, phosphorus is employed as the second n-type impurity. Ion implantation energy is, for example, not higher than 900 keV. Then, the second ion implantation mask (not shown) is removed from first main surface 1.

Figure 12:
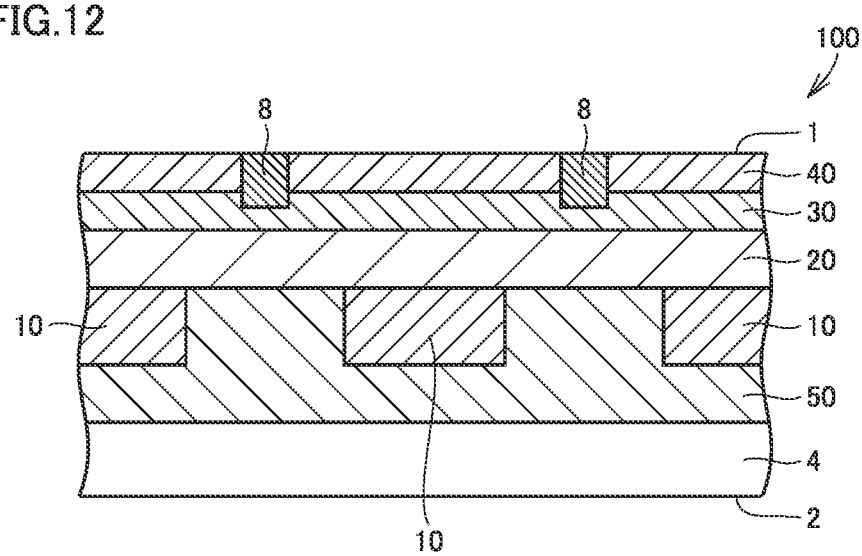
FIG. 12 is a schematic vertical cross-sectional view showing a second step in the method of manufacturing a silicon carbide semiconductor device according to the first embodiment.

A third ion implantation mask (not shown) is then provided on first main surface 1. Ions of the third p-type impurity are implanted into silicon carbide epitaxial layer 3. Contact region 8 having the p-type is thus formed. Contact region 8 is formed as being in contact with each of third impurity region 30 and fourth impurity region 40. For example, aluminum is employed as the third p-type impurity. Ion implantation energy is, for example, not higher than 900 keV. Then, the third ion implantation mask (not shown) is removed from first main surface 1. A portion in silicon carbide epitaxial layer 3 into which ions were not implanted is fifth impurity region 50. As set forth above, silicon carbide substrate 100 including first impurity region 10, second impurity region 20, third impurity region 30, fourth impurity region 40, fifth impurity region 50, and contact region 8 is prepared (see FIG. 12).

Figure 13:
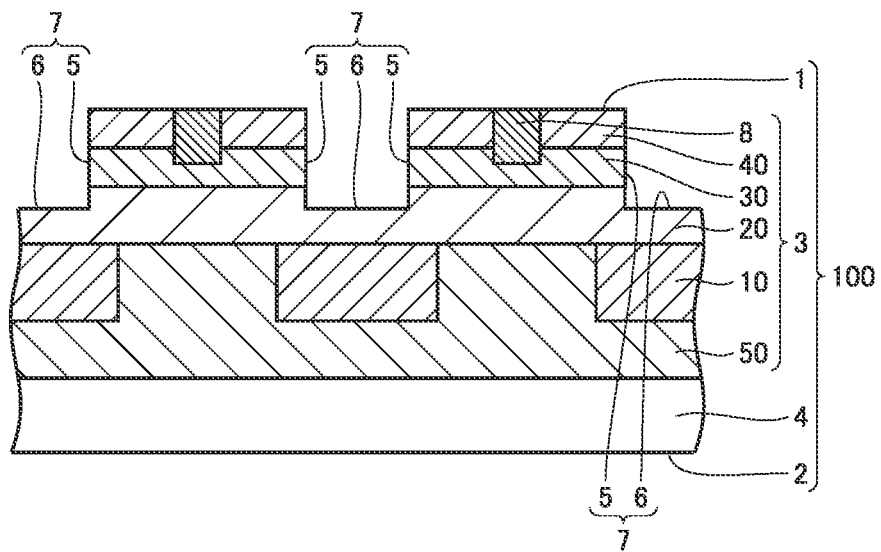
FIG. 13 is a schematic vertical cross-sectional view showing a third step in the method of manufacturing a silicon carbide semiconductor device according to the first embodiment.

Then, an etching mask (not shown) is formed on first main surface 1. The etching mask is made, for example, of a material including a deposited oxide film. The etching mask has an opening provided over a region where gate trench 7 is to be formed. Silicon carbide substrate 100 is then etched with the use of the etching mask. For example, in an atmosphere of $SF_6$ and $O_2$, fourth impurity region 40, third impurity region 30, and second impurity region 20 are anisotropically etched. For example, electron cyclotron resonance (ECR) plasma etching is adopted as anisotropic etching. Gate trench 7 is thus provided in first main surface 1 (see FIG. 13). Gate trench 7 includes side surface 5 and bottom surface 6. Side surface 5 is in contact with second impurity region 20, third impurity region 30, and fourth impurity region 40. Bottom surface 6 is in contact with second impurity region 20.

Then, gate insulating film 71 is formed. Specifically, gate insulating film 71 in contact with first main surface 1, side surface 5, and bottom surface 6 is formed. Gate insulating film 71 is in contact with fourth impurity region 40, third impurity region 30, and second impurity region 20 at side surface 5. Gate insulating film 71 is in contact with second impurity region 20 at bottom surface 6. Gate insulating film 71 is in contact with fourth impurity region 40 at first main surface 1. Gate insulating film 71 has a thickness, for example, not smaller than 40 nm and not larger than 150 nm.

Then, an NO annealing step is performed. Specifically, in an atmosphere containing nitrogen, silicon carbide substrate 100 on which gate insulating film 71 has been formed is subjected to heat treatment at a temperature, for example, not lower than 1100° C. and not higher than 1300° C. Examples of gas containing nitrogen include nitrogen monoxide diluted with nitrogen by 10%. Silicon carbide substrate 100 is annealed in gas containing nitrogen, for example, for a period not shorter than 30 minutes and not longer than 360 minutes.

Then, gate electrode 64 is formed. Specifically, gate electrode 64 is formed on gate insulating film 71 to bury the groove defined by gate insulating film 71. Gate electrode 64 is composed, for example, of a material containing polysilicon containing an impurity. Then, interlayer insulating film 72 is formed to cover gate electrode 64. Interlayer insulating film 72 includes, for example, at least any of the NSG film and the PSG film.

Figure 14:
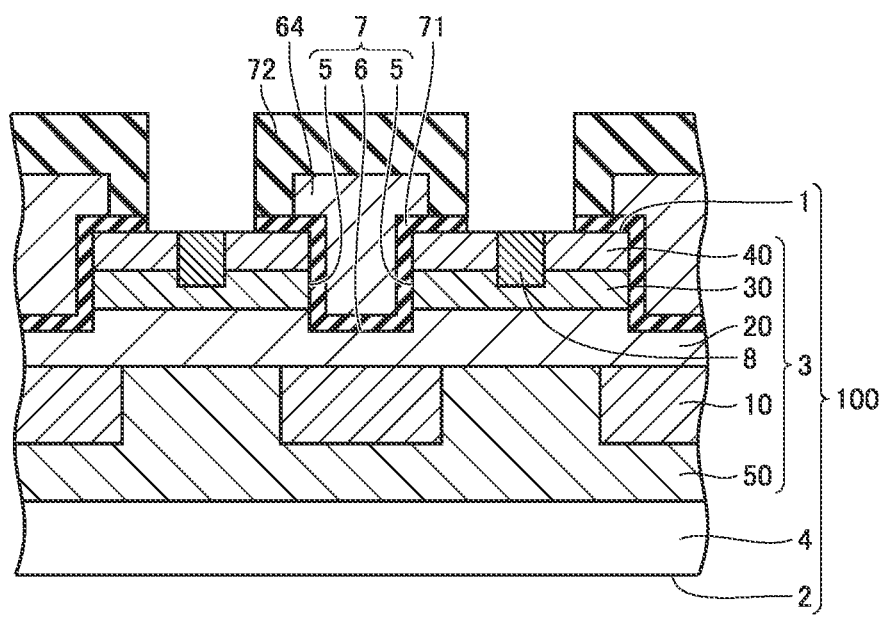
FIG. 14 is a schematic vertical cross-sectional view showing a fourth step in the method of manufacturing a silicon carbide semiconductor device according to the first embodiment.

Then, source electrode 60 is formed. Specifically, interlayer insulating film 72 and gate insulating film 71 are removed from a region where source electrode 60 is to be formed. A part of fourth impurity region 40 and contact region 8 are thus exposed through interlayer insulating film 72 and gate insulating film 71 (see FIG. 14). Then, electrode layer 61 is formed on first main surface 1 as being in contact with both of fourth impurity region 40 and contact region 8. Electrode layer 61 is formed, for example, by sputtering. Electrode layer 61 is composed, for example, of a material containing TiAlSi.

Then, silicon carbide substrate 100 in which electrode layer 61 has been formed is subjected to rapid thermal annealing (RTA) for approximately two minutes, for example, at a temperature not lower than 900° C. and not higher than 1100° C. As a result of reaction with silicon contained in silicon carbide substrate 100, at least a part of electrode layer 61 is thus converted to silicide. Electrode layer 61 thus establishes ohmic contact with fourth impurity region 40. Preferably, electrode layer 61 establishes ohmic contact with each of fourth impurity region 40 and contact region 8.

Then, source interconnection 62 is formed as being in contact with electrode layer 61 and covering interlayer insulating film 72. Source interconnection 62 is preferably composed of a material containing Al, such as a material containing AlSiCu. Then, a back surface of silicon carbide single-crystal substrate 4 is polished. The thickness of silicon carbide single-crystal substrate 4 is thus reduced. Then, drain electrode 63 is formed. Drain electrode 63 is formed as being in contact with second main surface 2 of silicon carbide substrate 100. Drain electrode 63 is composed, for example, of a material containing NiSi. Drain electrode 63 may be composed, for example, of TiAlSi.

Though drain electrode 63 is preferably formed by sputtering, it may be formed by vapor deposition. After drain electrode 63 is formed, it is heated, for example, by laser annealing. At least a part of drain electrode 63 is thus converted to silicide. MOSFET 200 shown in FIG. 1 is manufactured as set forth above.

Second Embodiment

A construction of silicon carbide semiconductor device 200 according to a second embodiment will now be described. Silicon carbide semiconductor device 200 according to the second embodiment is different from silicon carbide semiconductor device 200 according to the first embodiment mainly in that first impurity region 10 is opposed to contact region 8, but otherwise similar to silicon carbide semiconductor device 200 according to the first embodiment. Description is given below, with the difference from silicon carbide semiconductor device 200 according to the first embodiment being focused on.

Figure 15:
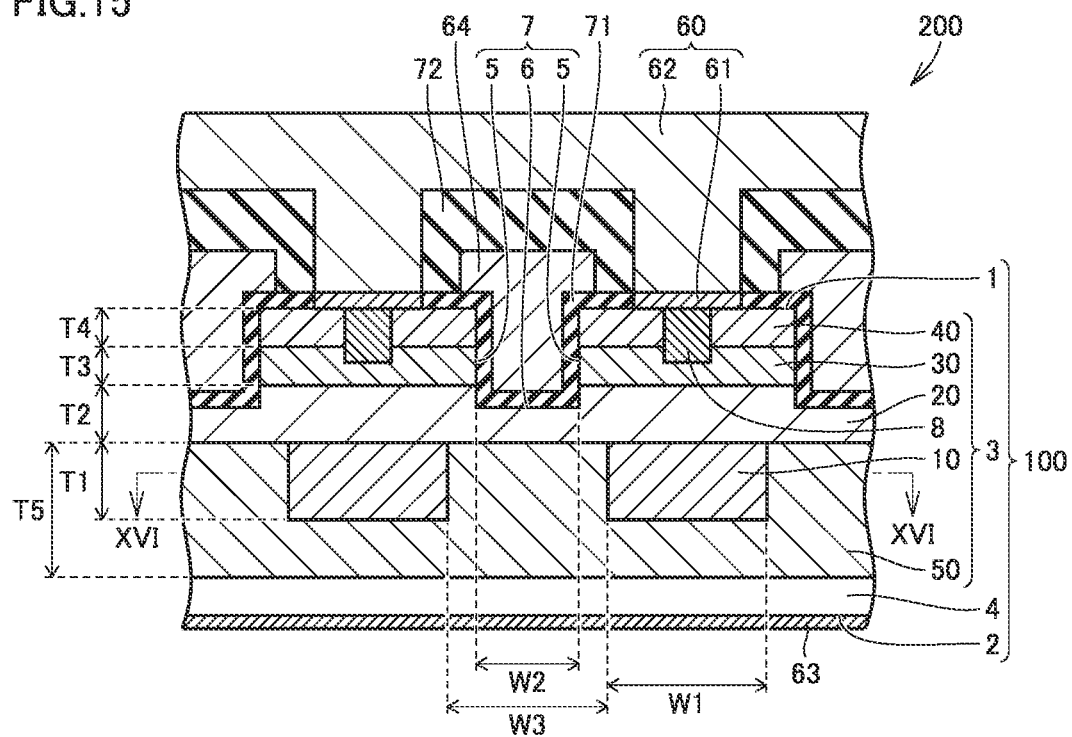
FIG. 15 is a schematic vertical cross-sectional view showing a structure of the silicon carbide semiconductor device according to a second embodiment.

As shown in FIG. 15, in silicon carbide semiconductor device 200 according to the second embodiment, first impurity region 10 is opposed to contact region 8. From another point of view, first impurity region 10 is located between contact region 8 and second main surface 2. From another point of view, first impurity region 10 is arranged as not being opposed to bottom surface 6 of gate trench 7. First impurity region 10 is opposed to each of third impurity region 30 and fourth impurity region 40. First impurity region 10 is opposed to electrode layer 61.

Figure 16:
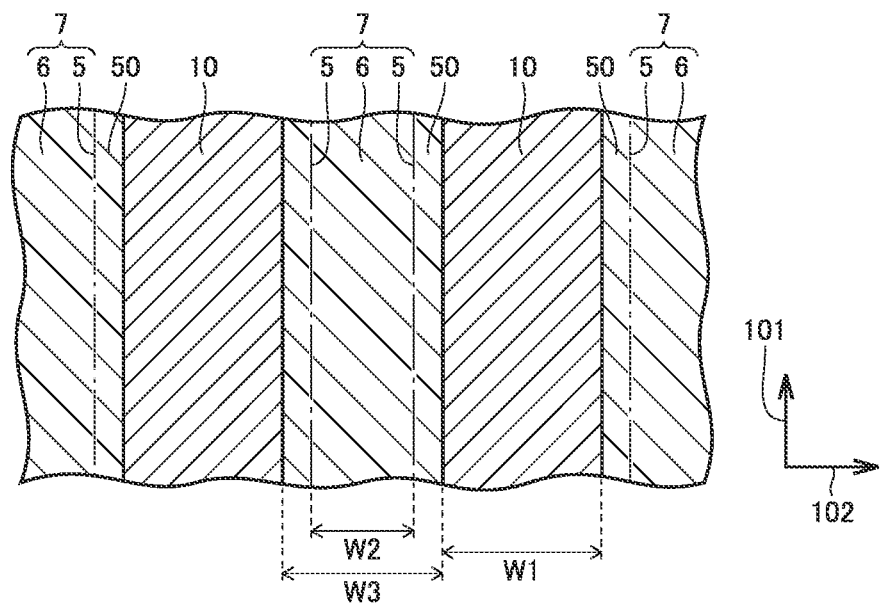
FIG. 16 is a schematic lateral cross-sectional view along the line XVI-XVI in FIG. 15.

FIG. 16 is a schematic lateral cross-sectional view along the line XVI-XVI in FIG. 15. As shown in FIG. 16, when viewed in the direction perpendicular to second main surface 2, each of first impurity region 10 and gate trench 7 extends along first direction 101. When viewed in the direction perpendicular to second main surface 2, first impurity region 10 is arranged as not being superimposed on gate trench 7. In second direction 102, gate trench 7 and first impurity region 10 are alternately arranged. When viewed in the direction perpendicular to second main surface 2, gate trench 7 is located between two adjacent first impurity regions 10.

Third Embodiment

A construction of silicon carbide semiconductor device 200 according to a third embodiment will now be described. Silicon carbide semiconductor device 200 according to the third embodiment is different from silicon carbide semiconductor device 200 according to the first embodiment mainly in that a direction of extension of first impurity region 10 is orthogonal to a direction of extension of gate trench 7, but otherwise similar to silicon carbide semiconductor device 200 according to the first embodiment. Description is given below, with the difference from silicon carbide semiconductor device 200 according to the first embodiment being focused on.

Figure 17:
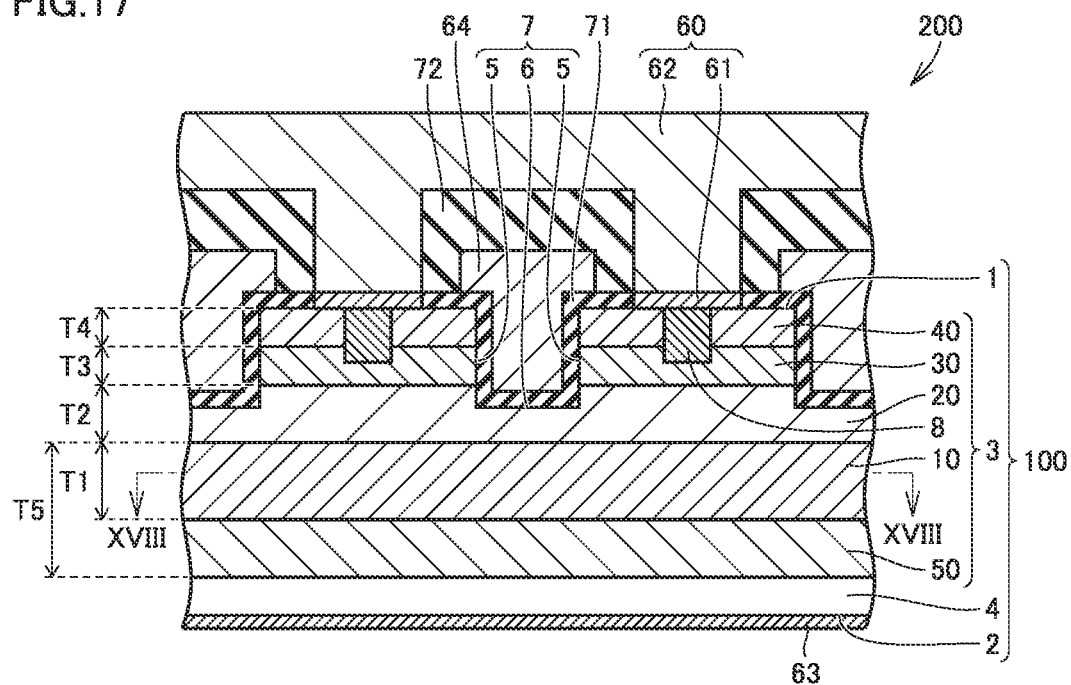
FIG. 17 is a schematic vertical cross-sectional view showing a structure of the silicon carbide semiconductor device according to a third embodiment.

As shown in FIG. 17, in silicon carbide semiconductor device 200 according to the third embodiment, first impurity region 10 is opposed to bottom surface 6 of gate trench 7, third impurity region 30, contact region 8, and electrode layer 61. From another point of view, first impurity region 10 is located between each of bottom surface 6 of gate trench 7, third impurity region 30, contact region 8, and electrode layer 61, and second main surface 2.

Figure 18:
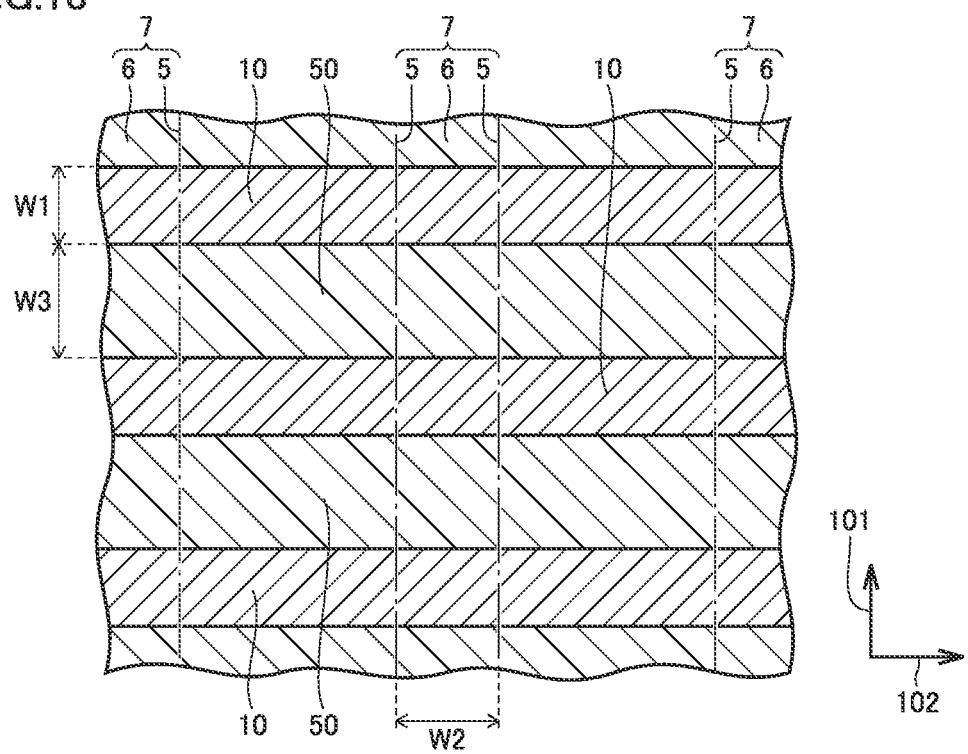
FIG. 18 is a schematic lateral cross-sectional view along the line XVIII-XVIII in FIG. 17.

FIG. 18 is a schematic lateral cross-sectional view along the line XVIII-XVIII in FIG. 17. As shown in FIG. 18, when viewed in the direction perpendicular to second main surface 2, bottom surface 6 of gate trench 7 extends along first direction 101 in parallel to second main surface 2 and first impurity region 10 extends along second direction 102 in parallel to second main surface 2 and perpendicular to first direction 101. From another point of view, the direction of extension of first impurity region 10 is orthogonal to the direction of extension of gate trench 7. The longitudinal direction of first impurity region 10 corresponds to the direction of the short side of the gate trench. Similarly, the direction of the short side of first impurity region 10 corresponds to the longitudinal direction of the gate trench.

First impurity regions 10 may be provided at regular intervals along first direction 101. Fifth impurity region 50 is arranged between two adjacent first impurity regions 10. When viewed in the direction perpendicular to second main surface 2, bottom surface 6 of gate trench 7 includes a portion (a first portion) superimposed on first impurity region 10 and a portion (a second portion) not superimposed on first impurity region 10. A fifth current flows to drain electrode 63 through fifth impurity region 50.

Though silicon carbide semiconductor device 200 according to the present disclosure is described above with reference to the MOSFET including gate trench 7 by way of example, silicon carbide semiconductor device 200 according to the present disclosure is not limited thereto. Silicon carbide semiconductor device 200 according to the present disclosure may be, for example, an insulated gate bipolar transistor (IGBT).

A function and effect of silicon carbide semiconductor device 200 according to the embodiments will now be described.

In silicon carbide semiconductor device 200 in which each of first impurity region 10 (an embedded p-type region), second impurity region 20 (the n-type current diffusion region), and third impurity region 30 (the p-type channel region) is formed by ion implantation, the concentration profile of the first n-type impurity in second impurity region 20 lies between the concentration profile of the first p-type impurity in first impurity region 10 and the concentration profile of the second p-type impurity in third impurity region 30. Therefore, in second impurity region 20, the first p-type impurity in a tail portion of the concentration profile of the first p-type impurity and the second p-type impurity in a tail portion of the concentration profile of the second p-type impurity are intermingled.

When an interval between first impurity region 10 and third impurity region 30 is small (in other words, the thickness of second impurity region 20 is small), the first n-type impurity in second impurity region 20 is neutralized by superimposition with the tail portion of the concentration profile of the first p-type impurity in first impurity region 10 and superimposition with the tail portion of the concentration profile of the second p-type impurity in third impurity region 30. In this case, second impurity region 20 does not have the n-type and silicon carbide semiconductor device 200 does not work. In order to set second impurity region 20 to the n-type, second impurity region 20 should have a large thickness. With increase in thickness of second impurity region 20, silicon carbide epitaxial layer 3 has a larger thickness. Therefore, silicon carbide epitaxial layer 3 is normally formed by epitaxial growth split into two stages.

Specifically, initially, a first silicon carbide layer is formed by epitaxial growth. Then, first impurity region 10 is formed by ion implantation into the first silicon carbide layer. Then, a second silicon carbide layer is formed on the first silicon carbide layer by epitaxial growth. Then, second impurity region 20, third impurity region 30, and fourth impurity region 40 are formed by ion implantation into the second silicon carbide layer. Then, gate trench 7 is formed in the second silicon carbide layer.

The silicon carbide layer formed by first epitaxial growth has first variation in thickness. The thickness of the first silicon carbide layer corresponds to the thickness of the drift layer (fifth impurity region 50). As the drift layer has a larger thickness, silicon carbide semiconductor device 200 has a higher breakdown voltage. In contrast, as the drift layer has a smaller thickness, silicon carbide semiconductor device 200 has a lower breakdown voltage. In other words, as variation in thickness of the first silicon carbide layer is larger, variation in breakdown voltage of silicon carbide semiconductor device 200 is also larger.

The second silicon carbide layer formed by second epitaxial growth has second variation in thickness. As the second silicon carbide layer has a larger thickness, a distance between bottom surface 6 of gate trench 7 and fourth impurity region 40 is longer. As the distance is longer, silicon carbide semiconductor device 200 has a lower breakdown voltage. In contrast, as the second silicon carbide layer has a smaller thickness, the distance between bottom surface 6 of gate trench 7 and fourth impurity region 40 is shorter. As the distance is shorter, silicon carbide semiconductor device 200 has a higher breakdown voltage. In other words, as variation in thickness of the second silicon carbide layer is larger, variation in breakdown voltage of silicon carbide semiconductor device 200 is also larger.

According to silicon carbide semiconductor device 200 in the present embodiment, in the direction from first main surface 1 toward second main surface 2, the concentration profile of the first p-type impurity has first relative maximum value N1. In the direction from first main surface 1 toward second main surface 2, the concentration profile of the first n-type impurity has second relative maximum value N2. In the direction from first main surface 1 toward second main surface 2, the concentration profile of the second p-type impurity has third relative maximum value N3. Third relative maximum value N3 is larger than second relative maximum value N2 and second relative maximum value N2 is larger than first relative maximum value N1.

In an example in which second relative maximum value N2 is larger than first relative maximum value N1, neutralization of the first n-type impurity in second impurity region 20 by the first p-type impurity in first impurity region 10 is less likely than in an example in which second relative maximum value N2 is smaller than first relative maximum value N1. Therefore, in the example in which second relative maximum value N2 is larger than first relative maximum value N1, second impurity region 20 can have a smaller thickness than in the example in which second relative maximum value N2 is smaller than first relative maximum value N1. Consequently, the silicon carbide epitaxial layer can be formed in one epitaxial growth. Therefore, as compared with an example in which the silicon carbide epitaxial layer is formed in epitaxial growth in two stages, variation in thickness of the silicon carbide epitaxial layer can be lessened. Consequently, variation in breakdown voltage of silicon carbide semiconductor device 200 can be lessened.

A lead time for forming the silicon carbide epitaxial layer can be shorter than in the example in which the silicon carbide epitaxial layer is formed by epitaxial growth in two stages. Consequently, cost for silicon carbide semiconductor device 200 can be lowered.

Silicon carbide substrate 100 after second epitaxial growth may have deformed as compared with silicon carbide substrate 100 after first epitaxial growth. In forming the silicon carbide epitaxial layer by epitaxial growth in two stages, defective exposure may occur due to the influence by deformation of silicon carbide substrate 100. By forming the silicon carbide epitaxial layer by one epitaxial growth, defective exposure can be suppressed.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

REFERENCE SIGNS LIST 1 first main surface; 2 second main surface; 3 silicon carbide epitaxial layer; 4 silicon carbide single-crystal substrate; 5 side surface; 6 bottom surface; 7 gate trench; 8 contact region; 10 first impurity region; 11 first concentration profile; 12 second concentration profile; 13 third concentration profile; 14 fourth concentration profile; 15 fifth concentration profile; 20 second impurity region; 30 third impurity region; 40 fourth impurity region; 50 fifth impurity region; 60 source electrode; 61 electrode layer; 62 source interconnection; 63 drain electrode; 64 gate electrode; 71 gate insulating film; 72 interlayer insulating film; 100 silicon carbide substrate; 101 first direction; 102 second direction; 103 arrow; 200 MOSFET (silicon carbide semiconductor device); A1 first position; A2 second position; A3 third position; A4 fourth position; A5 fifth position; A6 sixth position; N1 first relative maximum value; N2 second relative maximum value; N3 third relative maximum value; N4 fourth relative maximum value; N5 first concentration; N6 second concentration; N7 first relative minimum value; N8 fourth concentration; N9 second relative minimum value; T1 first thickness; T2 second thickness; T3 third thickness; T4 fourth thickness; T5 fifth thickness; W1 first width; W2 second width; W3 interval; n1 fifth relative maximum value; n2 sixth relative maximum value; n3 seventh relative maximum value; n4 eighth relative maximum value; n5 third concentration

The invention claimed is:

1. A silicon carbide semiconductor device comprising:
a silicon carbide substrate including a first main surface and a second main surface opposite to the first main surface, wherein
the silicon carbide substrate includes
a first impurity region containing a p-type impurity,
a second impurity region provided on the first impurity region, the second impurity region containing an n-type impurity,
a third impurity region provided on the second impurity region, the third impurity region containing a p-type impurity,
a fourth impurity region provided on the third impurity region at a distance from the second impurity region, the fourth impurity region containing an n-type impurity, and
a fifth impurity region in contact with each of the first impurity region and the second impurity region, the fifth impurity region containing an n-type impurity,
in the first main surface, a gate trench is provided, the gate trench including a side surface in contact with each of the second impurity region, the third impurity region, and the fourth impurity region and a bottom surface continuous to the side surface and being in contact with the second impurity region,
in a direction from the first main surface toward the second main surface through each of the first impurity region and the third impurity region, a concentration profile of the p-type impurity has a first relative maximum value and a third relative maximum value located closer to the first main surface than a position where the first relative maximum value is exhibited,
in the direction from the first main surface toward the second main surface through each of the second impurity region and the fourth impurity region, a concentration profile of the n-type impurity has a second relative maximum value and a fourth relative maximum value located closer to the first main surface than a position where the second relative maximum value is exhibited, and
the fourth relative maximum value is larger than the third relative maximum value, the third relative maximum value is larger than the second relative maximum value, and the second relative maximum value is larger than the first relative maximum value.

2. The silicon carbide semiconductor device according to claim 1, wherein
a total of a thickness of the first impurity region, a thickness of the second impurity region, a thickness of the third impurity region, and a thickness of the fourth impurity region is not larger than 1.5 μm.

3. The silicon carbide semiconductor device according to claim 1, wherein
the first impurity region has a thickness not larger than 0.5 μm.

4. The silicon carbide semiconductor device according to claim 1, wherein
the second impurity region has a thickness not larger than 0.5 μm.

5. The silicon carbide semiconductor device according to claim 1, wherein
the first relative maximum value is larger than $5\times10^{16}$ $cm^{-3}$.

6. The silicon carbide semiconductor device according to claim 1, wherein
the second relative maximum value is larger than $1\times10^{17}$ $cm^{-3}$.

7. The silicon carbide semiconductor device according to claim 1, wherein
the third relative maximum value is larger than $1\times10^{18}$ $cm^{-3}$.

8. The silicon carbide semiconductor device according to claim 1, wherein
the fourth relative maximum value is larger than $1\times10^{19}$ $cm^{-3}$.

9. The silicon carbide semiconductor device according to claim 1, wherein
when viewed in a direction perpendicular to the second main surface, at least a part of the first impurity region is arranged as being superimposed on the bottom surface.

10. The silicon carbide semiconductor device according to claim 9, wherein
when viewed in the direction perpendicular to the second main surface, the bottom surface extends along a first direction in parallel to the second main surface and the first impurity region extends along a second direction in parallel to the second main surface and perpendicular to the first direction.

11. The silicon carbide semiconductor device according to claim 9, wherein
when viewed in the direction perpendicular to the second main surface, the first impurity region extends along a first direction in parallel to the second main surface and the bottom surface extends along the first direction.

12. The silicon carbide semiconductor device according to claim 1, wherein
when viewed in a direction perpendicular to the second main surface, the first impurity region is arranged as not being superimposed on the bottom surface.

13. The silicon carbide semiconductor device according to claim 12, wherein
when viewed in the direction perpendicular to the second main surface, the first impurity region extends along a first direction in parallel to the second main surface and the bottom surface extends along the first direction.

* * * * *